United States Patent
Nakao et al.

(10) Patent No.: US 11,124,072 B2
(45) Date of Patent: Sep. 21, 2021

(54) BATTERY CONTROL DEVICE AND ELECTRIC MOTOR VEHICLE SYSTEM

(71) Applicant: VEHICLE ENERGY JAPAN INC., Hitachinaka (JP)

(72) Inventors: Ryohhei Nakao, Hitachinaka (JP); Keiichiro Ohkawa, Hitachinaka (JP)

(73) Assignee: VEHICLE ENERGY JAPAN INC., Hitachinaka (JP)

( * ) Notice: Subject to any disclaimer, the term of this patent is extended or adjusted under 35 U.S.C. 154(b) by 725 days.

(21) Appl. No.: 15/563,292

(22) PCT Filed: Mar. 16, 2016

(86) PCT No.: PCT/JP2016/058222
§ 371 (c)(1),
(2) Date: Sep. 29, 2017

(87) PCT Pub. No.: WO2016/158396
PCT Pub. Date: Oct. 6, 2016

(65) Prior Publication Data
US 2018/0074129 A1    Mar. 15, 2018

(30) Foreign Application Priority Data
Mar. 31, 2015   (JP) .............................. JP2015-073604

(51) Int. Cl.
*G01R 31/36*     (2020.01)
*B60L 3/00*      (2019.01)
(Continued)

(52) U.S. Cl.
CPC ................. *B60L 3/00* (2013.01); *B60L 50/60* (2019.02); *B60L 58/12* (2019.02); *G01R 31/36* (2013.01);
(Continued)

(58) Field of Classification Search
CPC ........... B60L 3/00; B60L 50/50; G01R 31/36; G01R 31/3648; G01R 31/3842;
(Continued)

(56) References Cited

U.S. PATENT DOCUMENTS 6,359,419 B1    3/2002  Verbrugge et al.
2005/0154544 A1 7/2005  Ono
(Continued)

FOREIGN PATENT DOCUMENTS

CN    103907030 A      7/2014
EP    1555537 A1 *    7/2005    ......... G01R 31/3828
(Continued)

OTHER PUBLICATIONS

International Search Report with English Translation and Written Opinion issued in corresponding application No. PCT/JP2016/058222.

(Continued)

*Primary Examiner* — Yoshihisa Ishizuka
(74) *Attorney, Agent, or Firm* — Foley & Lardner LLP

(57) ABSTRACT

Provided are a battery control device which can estimates an SOC of a battery with a high accuracy, and an electric motor vehicle system. The battery control device (190) includes a feature amount calculation unit (152) which calculates a feature amount indicating a charging/discharging pattern of the battery, a first charging state amount calculation unit (151-1) which calculates a first charging state amount (SOCi) of the battery on the basis of a first battery state amount, a second charging state amount calculation unit (151-2) which calculates a second charging state amount (SOCv) of the battery on the basis of a second battery state amount, and a third charging state amount calculation unit (151-3) which calculates a third charging state amount (Continued)

(SOC(t)) on the basis of the feature amount, the first charging stage amount, the second charging stage amount.

7 Claims, 26 Drawing Sheets

(51) Int. Cl.
    *G01R 31/3842*      (2019.01)
    *G01R 31/367*      (2019.01)
    *G01R 31/389*      (2019.01)
    *H01M 10/48*      (2006.01)
    *H02J 7/00*      (2006.01)
    *B60L 50/60*      (2019.01)
    *B60L 58/12*      (2019.01)

(52) U.S. Cl.
    CPC ....... *G01R 31/367* (2019.01); *G01R 31/3648* (2013.01); *G01R 31/389* (2019.01); *G01R 31/3842* (2019.01); *H01M 10/48* (2013.01); *H02J 7/00* (2013.01); *Y02T 10/70* (2013.01); *Y02T 10/72* (2013.01); *Y02T 90/14* (2013.01)

(58) Field of Classification Search
    CPC ... G01R 31/367; G01R 31/389; H01M 10/48; H02J 7/00; Y02T 10/7005; Y02T 90/14; Y02T 10/7241; Y02T 10/7044
    See application file for complete search history.

(56) References Cited

U.S. PATENT DOCUMENTS

| 2014/0042976 | A1* | 2/2014 | Lan | H02J 7/0068 |
| | | | | 320/130 |
| 2014/0225567 | A1* | 8/2014 | Stichowski | B60L 3/003 |
| | | | | 320/109 |
| 2014/0257726 | A1 | 9/2014 | Baba et al. | |

FOREIGN PATENT DOCUMENTS

| JP | 2003-068370 A | 3/2003 |
| JP | 2005-201743 A | 7/2005 |
| JP | 2007-323999 A | 12/2007 |
| WO | WO-2013/051241 A1 | 4/2013 |

OTHER PUBLICATIONS

Office Action issued in corresponding Chinese Patent Application No. 201680019606.7 dated Jun. 4, 2019.

Extended European Search Report dated Sep. 28, 2018 in Application No. 16772279.2.

* cited by examiner

BATTERY CONTROL DEVICE AND ELECTRIC MOTOR VEHICLE SYSTEM

TECHNICAL FIELD

The present invention relates to a battery control device, and an electric motor vehicle system equipped with the battery control device.

BACKGROUND ART

An electric motor vehicle system mounted in an electric motor vehicle such as an electric vehicle (EV), a plug-in hybrid electric vehicle (PHEV), and a hybrid electric vehicle (HEV) includes a battery control device which detects a voltage, a current, and a temperature of a battery to bring out the performance of the battery to the maximum and calculates a state of charge (SOC) and a stage of health (SOH) of the battery on the basis of these detected values. There are two methods of calculating the SOC of the battery as follows.

1. A method of obtaining an open circuit voltage (OCV) on the basis of the voltage (in general, a close circuit voltage (CCV)) of the battery and the current flowing to the battery, and calculating the SOC from the obtained OCV (referred to as an SOCv method)

2. A current integration method in which the SOC is calculated on the basis of the battery voltage considered as the OCV immediately after the vehicle system is activated, an integration result of the current, and a full-charged capacity of the battery (referred to as an SOCi method)

In the SOCv method, there is a need to use an internal resistance value of the battery when the OCV is obtained from the battery voltage, and an estimated value of the internal resistance is generally used. However, internal resistance characteristics of the battery have a high level of dependence on the battery temperature, and the characteristics tend to be complicated especially in a low temperature. As a result, there is a concern that an estimation accuracy of the internal resistance is lowered. Accordingly, there is a concern that the estimation accuracy of the OCV and the SOC is also lowered.

Therefore, PTL 1 discloses an invention in which polarization characteristics of components of the battery are modeled to increase the estimation accuracy in the SOCv method even at a low temperature. However, the polarization characteristics are differently expressed according to a history of the current flowing to the battery (running history) and degradation. When the complicating internal resistance characteristics of the battery are modeled with a high accuracy, the modeling is complicated, and there may be need a highly loaded process for the calculation. In addition, there is a need to acquire a battery parameter included in the complicated polarization modeling whenever a material is changed, and thus there is a concern that the processes may be increased in number.

On the other hand, in the SOCi method, there may occur an SOC error since a reading error of the current is integrated with time.

CITATION LIST

Patent Literature

PTL 1: JP 2003-68370 A

SUMMARY OF INVENTION

Technical Problem

In this way, there is a need to solve the problems in the SOCv method and the SOCi method, and the SOC is preferably estimated with a high accuracy.

Solution to Problem (1) A battery control device according to a preferable aspect of the invention includes: a feature amount calculation unit that calculates a feature amount indicating a charging/discharging pattern of a battery; a first charging state amount calculation unit that calculates a first charging state amount (SOCi) of the battery on the basis of a first battery state amount; a second charging state amount calculation unit that calculates a second charging state amount (SOCv) of the battery on the basis of a second battery state amount; and a third charging state amount calculation unit that calculates a third charging state amount (SOC) of the battery on the basis of the feature amount, the first charging state amount, and the second charging state amount.

(2) An electric motor vehicle system according to a preferable aspect of the invention converts a DC current from a battery into an AC current using an inverter to supply the AC current to a running motor. The electric motor vehicle system includes a charging/discharging request command determining unit which determines whether a charging/discharging of the battery is deviated to the charging or the discharging and outputs a command to request an adjustment of the charging/discharging in a case where it is determined that the batter is deviated to the charging or the discharging, and a drive control device which controls operations of the inverter and the running motor to equalize frequencies of the charging and the discharging in a case where the battery is deviated to the charging or the discharging. (3) An electric motor vehicle system according to another preferable aspect of the invention converts a DC current from a battery into an AC current using an inverter to supply the AC current to a running motor. The electric motor vehicle system includes a charging/discharging request command determining unit which determines whether a charging/discharging of the battery is deviated to the charging or the discharging and outputs a command to request an adjustment of the charging/discharging in a case where it is determined that the battery is deviated to the charging or the discharging, and a driving mode select unit which selects a driving mode of an electric motor vehicle from any one of a first driving mode in which a frequency of any one of the charging and the discharging of the battery is high and a second driving mode in which the frequencies of the charging and the discharging of the battery are the same degree. The driving mode select unit changes the first driving mode to the second driving mode when a first condition where the first driving mode is selected and a second condition where the charging/discharging request command determining unit determines that the battery is deviated to the charging or the discharging are satisfied.

Advantageous Effects of Invention

According to a battery control device of the invention, an SOC of a battery can be estimated with a high accuracy. Therefore, it is possible to use the battery for a long lifespan.

In addition, according to an electric motor vehicle system of the invention, an inverter and a motor can be driven to make an SOC calculation accuracy preferable, so that the reliability can be improved.

DESCRIPTION OF EMBODIMENTS

Hereinafter, the description will be given about an example in which the invention is applied to an electric motor vehicle system and a battery control device in a plug-in hybrid electric vehicle (PHEV).

First Embodiment

Figure 1:
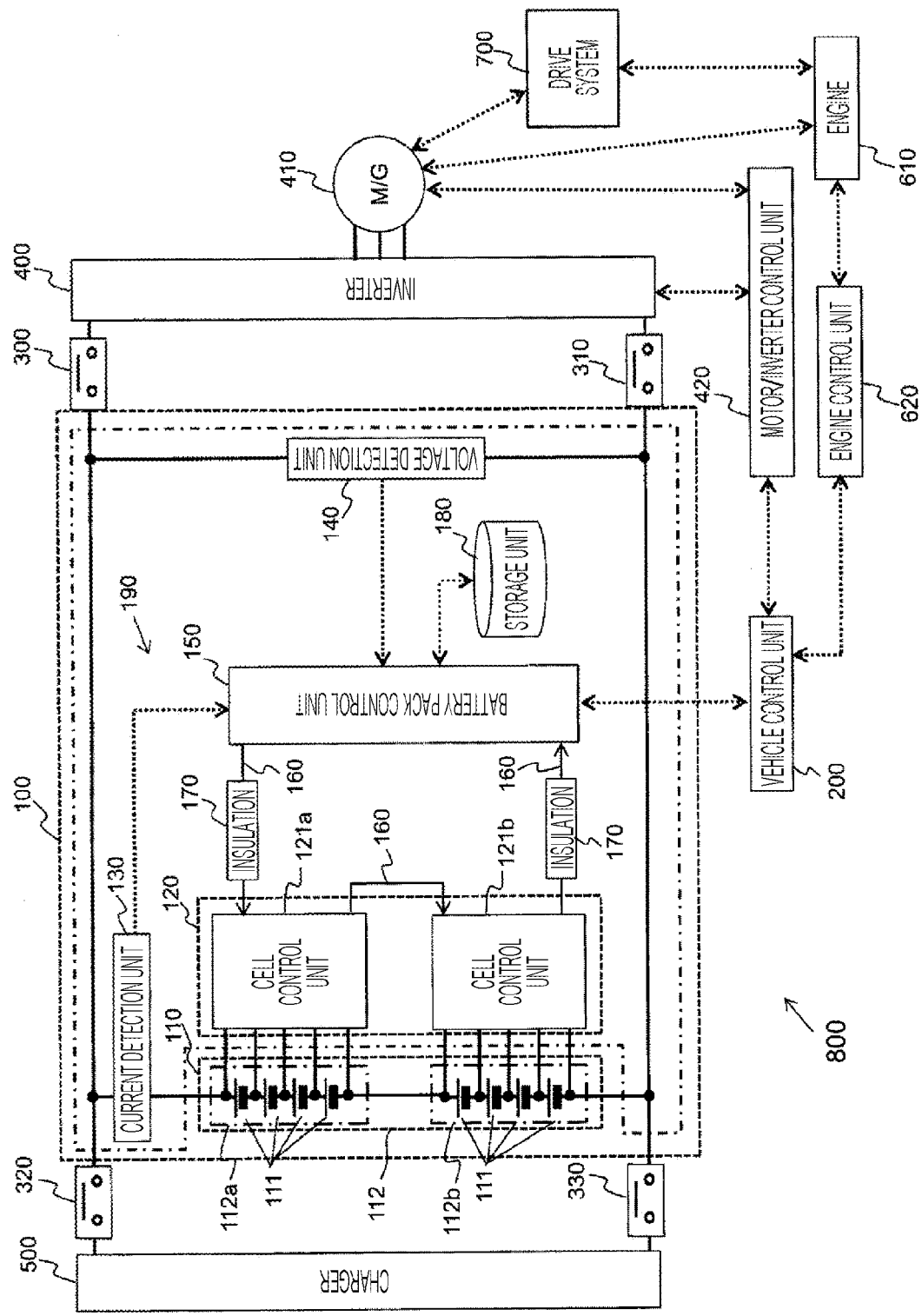
FIG. 1 is a block diagram illustrating an electric motor vehicle system of a plug-in hybrid electric vehicle according to a first embodiment.

FIG. 1 illustrates an electric motor vehicle system 800, a drive system 700, and a charger 500 of the plug-in hybrid electric vehicle in a first embodiment. The electric motor vehicle system 800 includes a battery system 100, an inverter 400, a motor 410, a motor/inverter control unit 420, relays 300, 310, 320, and 330, an engine 610, an engine control unit 620, and a vehicle control unit 200.

The drive system 700, while not illustrated, includes wheels, a drive shaft, a propeller shaft, a differential gear, and a hydraulic brake. The drive system 700 receives power from the motor 410 and power from the engine 610 to run the electric vehicle, and drives the electric motor vehicle to run.

The motor 410 receives regenerative energy from the drive system 700 to generate power, and supplies the power to a cell 111 through the inverter 400.

The vehicle control unit 200 communicates with a battery pack control unit 150, the motor/inverter control unit 420, and the engine control unit 620. With this communication, various types of information such as the SOC of the battery and a speed of the electric motor vehicle are obtained. The vehicle control unit 200 controls the battery pack control unit 150, the motor/inverter control unit 420, and the engine control unit 620 according to the various types of information and, as a result, supplies the power to the drive system 700 to obtain a driving force. For example, the vehicle control unit 200 determines a power distribution between the engine 610 and the drive system 700 of the motor 410, and drives the motor 410 in a power generation mode using the regenerative energy from the drive system 700.

The motor/inverter control unit 420 performs a switching control on the inverter 400 to convert DC power of a battery pack 110 into AC power. The converted AC power is supplied to the motor 410, and the motor 410 is controlled to drive.

The engine control unit 620 controls the output of the engine 610 to drive the drive system 700 by the power and also to drive the motor 410 when there is a request of power generation.

The configuration of the battery system 100 will be described. The battery system 100 includes the battery pack 110 which includes cell groups 112a and 112b configured by a plurality of cells 111, a cell management unit 120 which monitors the state of the cell 111, a current detection unit 130 which detects a current flowing to the battery system 100, a voltage detection unit 140 which detects a total voltage of the battery pack 110, the battery pack control unit 150 which controls the battery pack 110, and a storage unit 180 which stores information on battery characteristics of the battery pack 110, the cell 111, and the cell group 112.

Further, in the following, a system configuration equipped with the current detection unit 130, the voltage detection unit 140, the storage unit 180, the cell management unit 120, and the battery pack control unit 150 will be described as a battery control device 190.

The battery pack control unit 150 receives a plurality of signals as follows. The plurality of signals includes measurement values of a battery voltage and a temperature of the cell 111 which are output from the cell management unit 120, a diagnosis result on whether the cell 111 is overcharged or overdischarged, an abnormal signal which is output in a case where a communication error occurs in the cell management unit 120, a current value transmitted from the current detection unit 130, a total voltage value of the battery pack 110 transmitted from the voltage detection unit 140, and a signal output from the vehicle control unit 200 which is a host control device. The battery pack control unit 150 performs a state detection of the battery pack 110 on the basis of the input information. In addition, a process result of the battery pack control unit 150 is transmitted to the cell management unit 120 and the vehicle control unit 200.

Figure 4:
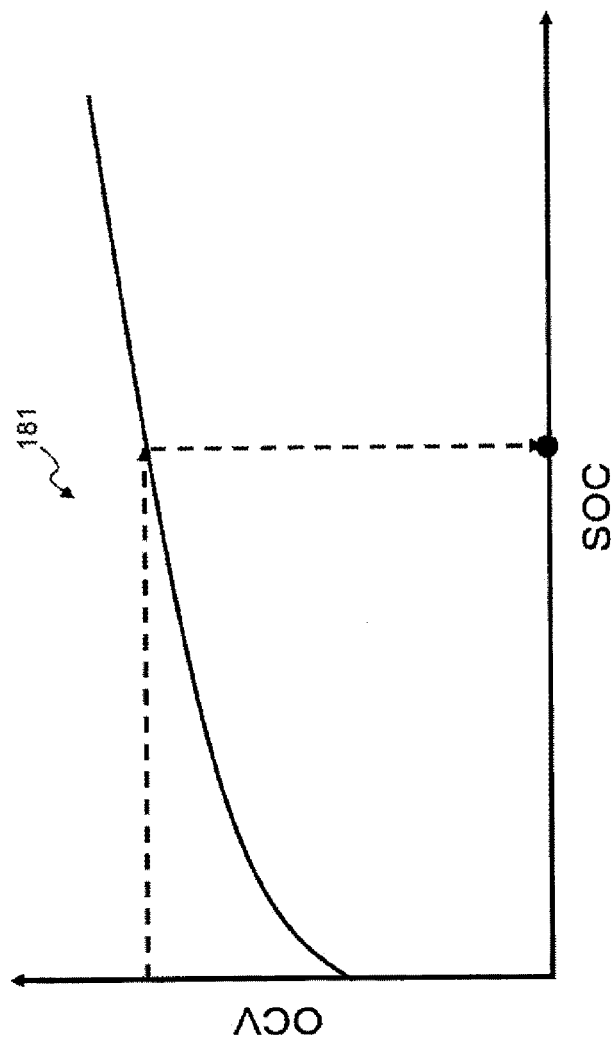
FIG. 4 is a graph illustrating a relation between SOC and OCV of a battery.

The battery pack 110 is configured to be electrically connected to the plurality of cells 111 (for example, a lithium ion battery) in series which is able to accumulate and emit the electric energy (charging/discharging of the DC power). The output voltage of one cell 111 is 3.0 to 4.2 V (average output voltage: 3.6 V). There is a correlation between the OCV and the SOC of the cell 111 as illustrated in FIG. 4, and the battery pack 110 of the plurality of cells 111 also has the correlation between the OCV and the SOC as illustrated in FIG. 4 as a whole.

Further, the specification of the cell 111 is not limited to the above description.

The cells 111 of the battery pack 110 are divided into groups in a unit of predetermined number. The grouped cells 111 are electrically connected in series to form the cell group 112. The predetermined number may be classified into, for example, one, four, six, and so on, or may be classified into plural cells by combining four and six cells.

The cell management unit 120 monitors a state of the cell 111 of the battery pack 110. The cell management unit 120 includes a cell control unit 121 provided in each cell group 112. In FIG. 1, cell control units 121a and 121b are provided in correspondence with the cell groups 121a and 112b. The cell control unit 121 monitors and controls the state of the cell 111 of the cell group 112.

In this embodiment, in order to simplify the explanation, the battery pack 110 is configured such that four cells 111 are electrically connected in series to form the cell groups 112a and 112b, and further electrically connected in series to form eight cells 111 in total. In addition, the cell control units 121a and 121b are provided to monitor the state of the cell 111 in correspondence with the cell groups 112a and 112b.

The battery pack 110 is charged with the power supplied from the charger 500 through the relays 320 and 330. In addition, the battery pack 110 is charged also with the power which is converted by the motor 410 by converting the regenerative energy of the drive system 700.

Figure 2:
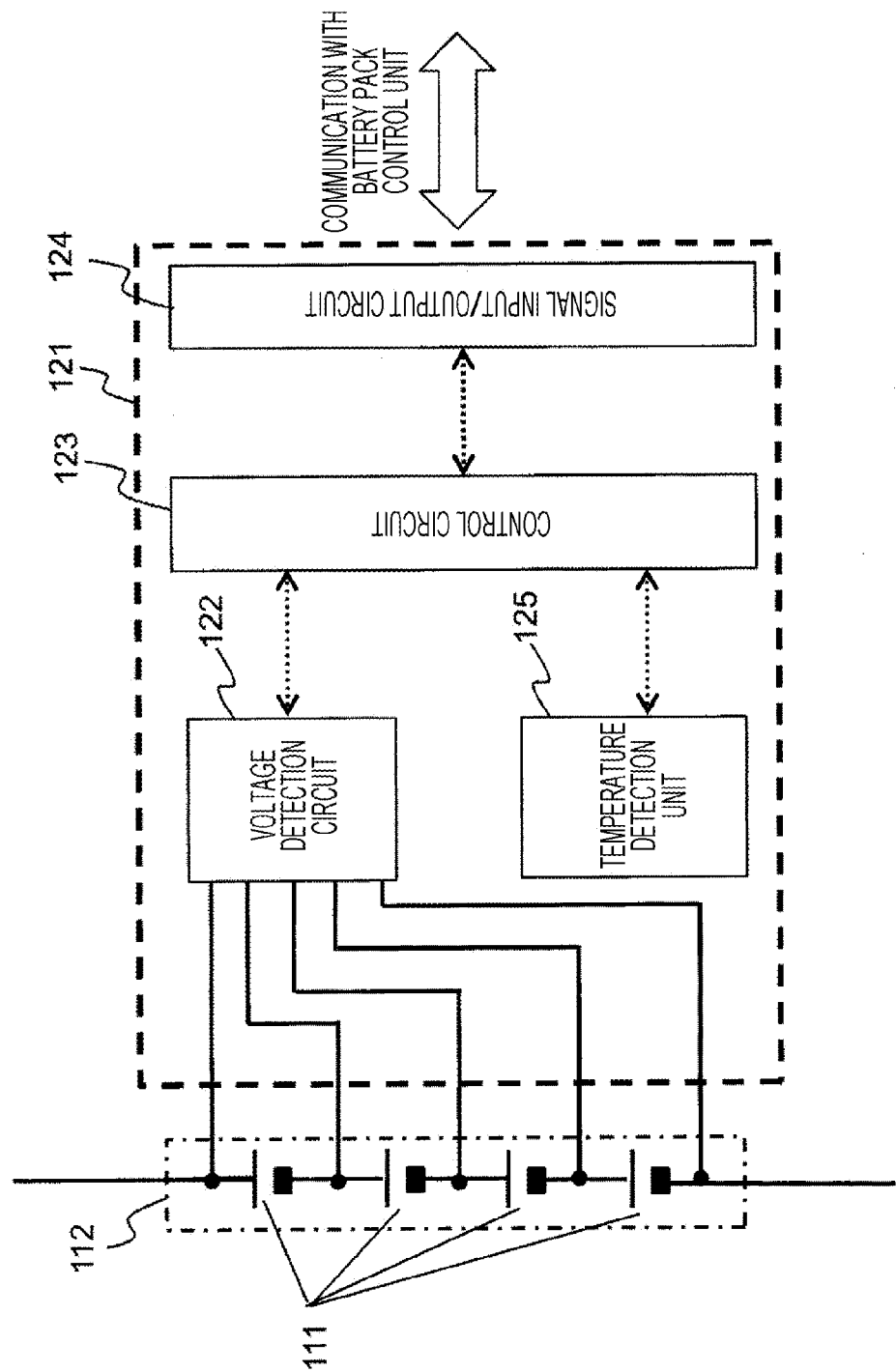
FIG. 2 is a block diagram illustrating a cell control unit of a battery system of FIG. 1.

FIG. 2 is a diagram illustrating a circuit configuration of the cell control unit 121. The cell control unit 121 includes a voltage detection circuit 122, a control circuit 123, a signal input/output circuit 124, and a temperature detection unit 125. The voltage detection circuit 122 measures a voltage between the terminals of each cell 111. The temperature detection unit 125 measures a temperature of the cell group 112. The control circuit 123 receives the measurement results from the voltage detection circuit 122 and the temperature detection unit 125, and transmits the results to the battery pack control unit 150 through the signal input/output circuit 124.

Further, a balancing circuit generally mounted in the cell control unit 121 (that is, a circuit configuration which averages a deviation in the voltage and the SOC between the cells 111 caused by a deviation in self-discharging and current consumption) is well known and thus omitted in the drawing.

The temperature detection unit 125 equipped in the cell control unit 121 in FIG. 2 has a function of measuring a temperature of the cell group 112. The temperature detection unit 125 measures one temperature of the whole cell group 112, and uses the temperature as a representative temperature of the cells 111 of the cell group 112. The temperature measured by the temperature detection unit 125 is used in various calculations to detect the state of the cell 111, the cell group 112, or the battery pack 110.

The temperature detection unit 125 is provided in each cell 111 to measure the temperature of each cell 111, and can perform various calculations on the basis of the temperature of each cell 111.

In FIG. 2, the temperature detection unit 125 is simply illustrated, and specific functions are as follows. In practice, a temperature sensor is installed in a temperature measuring target, and the installed temperature sensor outputs temperature information as a voltage. The measurement result is transmitted to the signal input/output circuit 124 through the control circuit 123, and the signal input/output circuit 124 outputs the measurement result to the outside of the cell control unit 121. The functions of realizing such a series of processing flow are installed as the temperature detection unit 125 in the cell control unit 121.

The voltage detection circuit 122 can be used to measure the temperature information (voltage).

The configuration of the battery pack control unit 150 will be described on the basis of FIG. 3.

The battery pack control unit 150 includes a battery state calculation unit 151 and a load feature amount calculation unit 152. The battery state calculation unit 151 receives a total voltage from the voltage detection unit 140, a current from the current detection unit 130, and an inter-terminal voltage and a temperature of the cell 111 from the cell control unit 121. The current is also input to the load feature amount calculation unit 152, and the load feature amount calculation unit 152 calculates a feature amount (load feature amount) of a charging/discharging pattern on the basis of the current and outputs the feature amount to the battery state calculation unit 151. The battery state calculation unit 151 calculates various types of battery states such as the SOC of the battery on the basis of a battery parameter including the relation (FIG. 4) between the SOC and the OCV of the cell 111 which are stored in advance, and the load feature amount from the load feature amount calculation unit 152. Then, the SOC calculation result and a command based on the SOC calculation result are output to the cell management unit 120 and the vehicle control unit 200. The details of these calculation units 151 and 152 will be described below.

The storage unit 180 illustrated in FIG. 1 stores information such as internal resistance characteristics of the battery pack 110, the cell 111, the cell group 112, capacities when being fully charged, polarization resistance characteristics, deterioration characteristics, individual difference information, and a correspondence relation between the SOC and the OCV.

Further, in this embodiment, the storage unit 180 is configured to be installed in the outside of the battery pack control unit 150 or the cell management unit 120. However, the storage unit may be configured to be installed in the battery pack control unit 150 or the cell management unit 120, and stores the above information.

Figure 5:
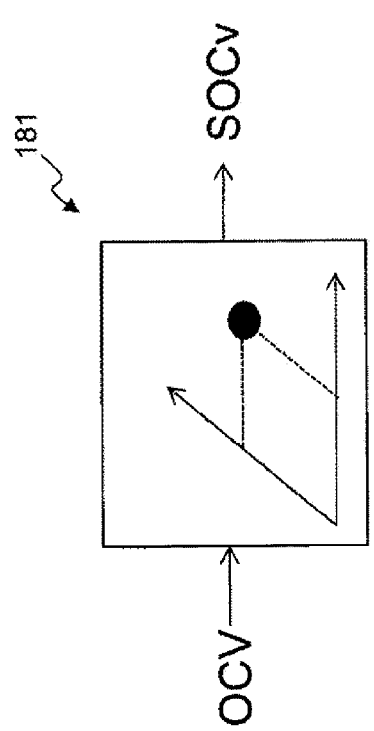
FIG. 5 is a diagram for describing a data table illustrating a relation between the SOC and the OCV.

FIG. 5 is a diagram illustrating an example of an SOC table 181 which is stored in the storage unit 180. The SOC table 181 is a data table which describes the correspondence relation between the OCV of the cell 111 and the SOC of the cell 111 according to a temperature. As described above, the storage unit 180 also stores a data table other than the SOC table 181. For example, similarly to the SOC table 181, the data table is also a table in which various types of battery information such as the internal resistance characteristics and the polarization resistance characteristics are associated to various types of parameters such as the SOC and the temperature.

Further, while the data table has been used in the description of this embodiment, the correspondence relation between the OCV and the SOC may be represented by a numerical expression, and not limited to such a data table.

The vehicle control unit 200 of FIG. 1 controls the inverter 400 connected to the battery system 100 through the relays 300 and 310, and the charger 500 connected to the battery system 100 through the relays 320 and 330 on the basis of the information of the battery pack control unit 150. When the electric motor vehicle is running, the battery system 100 is connected to the inverter 400, and the motor 410 is driven using the energy accumulated by the battery pack 110. When charging, the battery system 100 is connected to the charger 500, and receives the power from a household power source or a charging stand to be charged.

The battery pack control unit 150 and the cell management unit 120 are connected by a signal communication line 160 through an insulation element 170 such as a photocoupler, and transmit/receive various types of signals. The reason why the insulation element 170 is provided is because an operation power source is different between the battery pack control unit 150 and the cell management unit 120. In other words, the cell management unit 120 operates by the power from the battery pack 110, and the battery pack control unit 150 operates by the power from an in-vehicle battery (for example, 12 V battery).

The insulation element 170 may be mounted in a circuit board of the cell management unit 120, or may be mounted in a circuit board of the battery pack control unit 150. Further, the insulation element 170 may be omitted depending on a system configuration.

The description will be described about the communication between the battery pack control unit 150 and the cell control units 121a and 121b in this embodiment.

The cell control units 121a and 121b are connected in series in a descending order of potentials of the cell groups 112a and 112b which are monitored respectively. A signal transmitted by the battery pack control unit 150 is input to the cell control unit 121a by the signal communication line 160 through the insulation element 170. Similarly, the output of the cell control unit 121a and the input of the cell control unit 121b are also connected by the signal communication line 160 to transmit a signal.

Further, in this embodiment, the insulation element 170 is not provided in the signal communication line 160 between the cell control units 121a and 121b, and the insulation element 170 may be provided.

The output of the battery pack control unit 150 is transmitted to the cell control unit 121a by the signal communication line 160 through the insulation element 170, and further transmitted to the cell control unit 121b by the signal communication line 160. Then, the output of the cell control unit 121b is transmitted to the battery pack control unit 150 by the signal communication line 160 through the insulation element 170. In this way, the battery pack control unit 150 and the cell control units 121a and 121b are connected in a loop shape by the signal communication line 160. The loop connection may be called a daisy-chain, a sequential-chain, or a series-chain.

Figure 6:
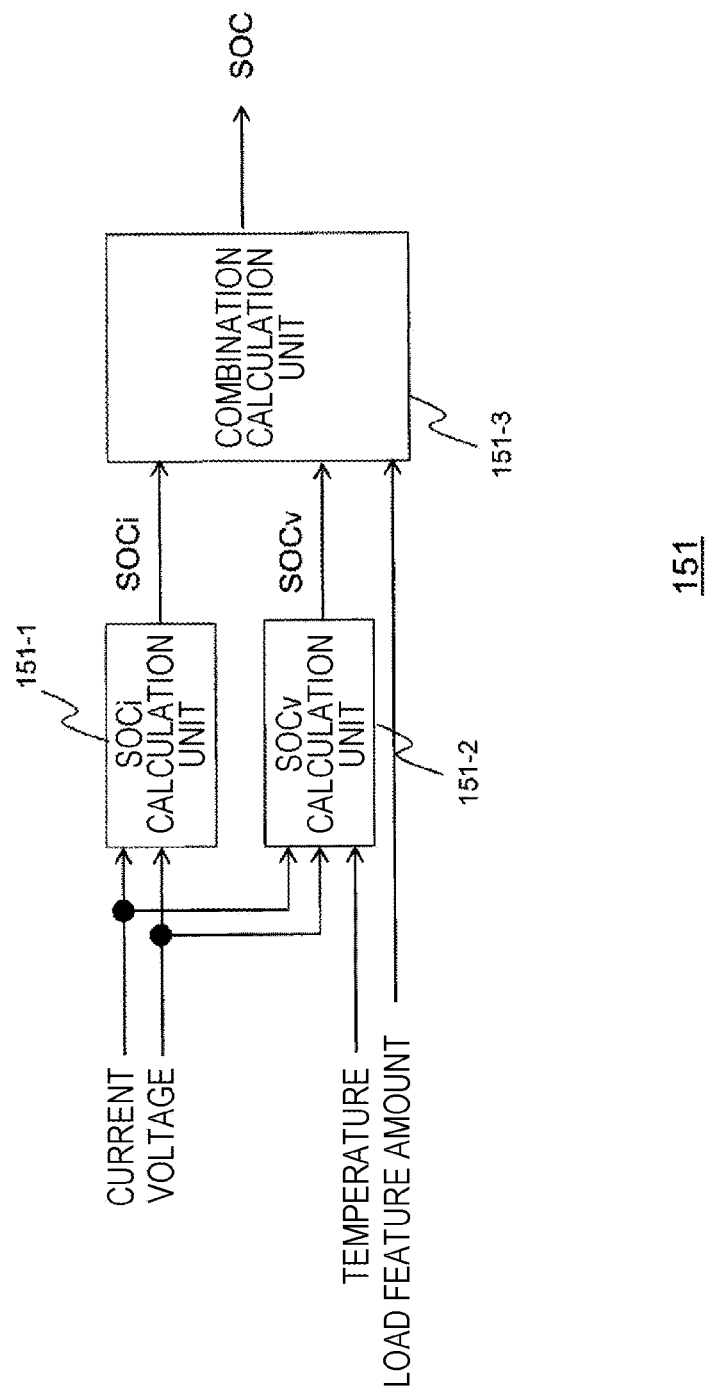
FIG. 6 is a block diagram illustrating a battery state calculation unit which forms the battery pack control unit in the first embodiment.

The battery state calculation unit 151 of the battery pack control unit 150 will be described on the basis of FIG. 6.

The battery state calculation unit 151 includes an SOCi calculation unit 151-1, an SOCv calculation unit 151-2, and a combination calculation unit 151-3.

The SOCi calculation unit 151-1 outputs the SOC in an SOCi calculation method using Expressions (1A) to (1C). In other words, the measured voltage and current of the battery are input to the SOCi calculation unit 151-1. The SOCi calculation unit 151-1 calculates the SOC (hereinafter, SOCi) on the basis of an integrated value of the voltage and the current of the open circuit at the time when the vehicle is activated, and outputs the SOC.

The SOCv calculation unit outputs the SOC in an SOCv calculation method using Expressions (2A) to (2D). In other words, the SOCv calculation unit estimates the OCV on the basis of the measured voltage, current, and temperature of the battery at the time when the vehicle runs, and calculates the SOC (hereinafter, SOCv) on the basis of the estimated OCV, and outputs the SOC.

The SOCi, the SOCv, and the load feature amount are input to the combination calculation unit 151-3. The combination calculation unit 151-3 weights and averages the SOCi and the SOCv according to the charging/discharging pattern, that is, the load feature amount, and combines and outputs the result. The battery state calculation unit 151-1 outputs the combined SOC calculation result as a final SOC calculation value.

The SOCi is called a first battery state amount, the SOCv is called as a second battery state amount, and the combined SOC is called a third battery state amount.

Figure 7:
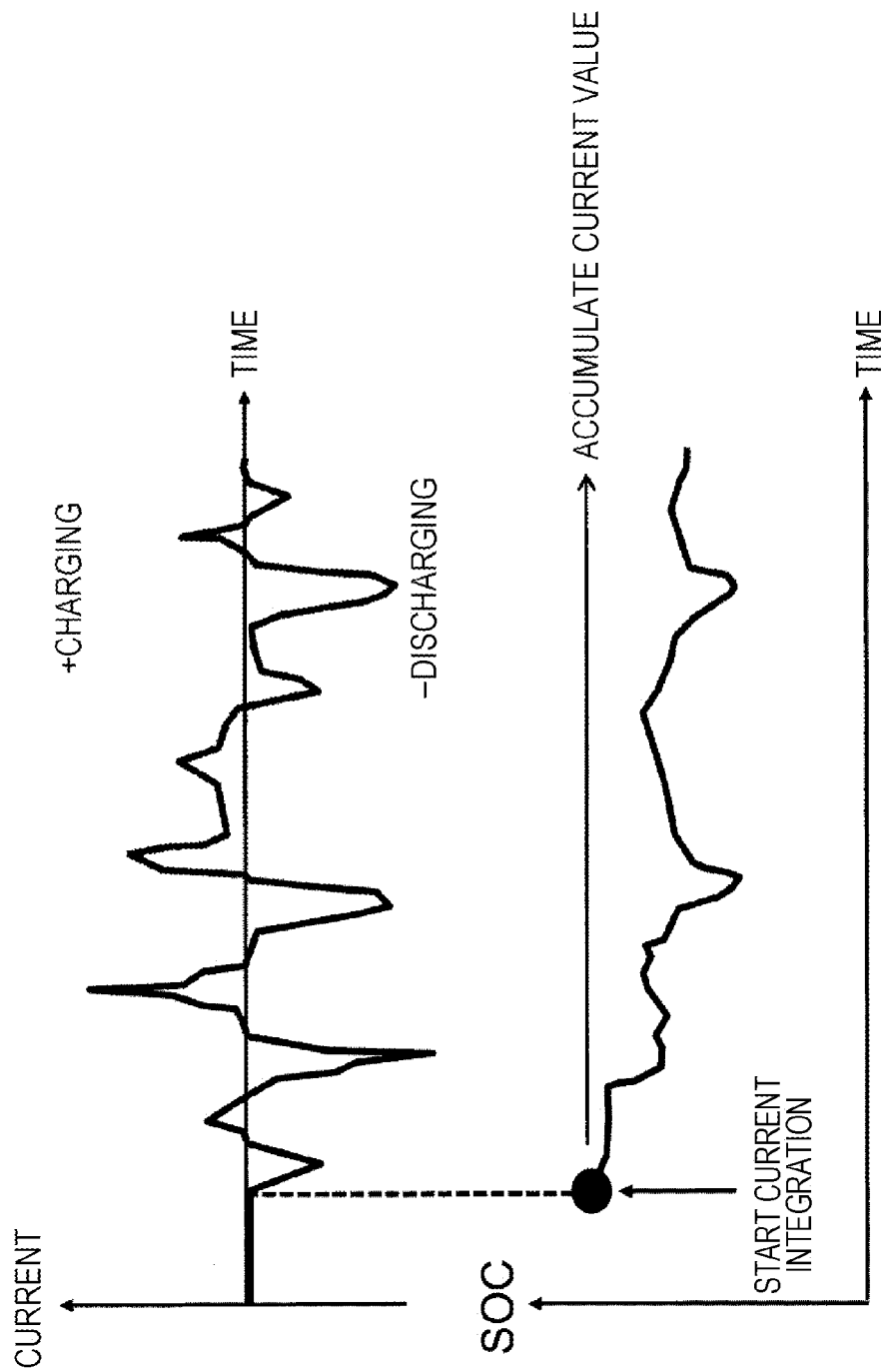
FIG. 7 is a diagram for describing an SOC calculation method based on a current.

The calculation performed by the SOCi calculation unit 151-1 will be described on the basis of FIG. 7.

The SOCi is calculated as follows. The SOC (hereinafter, referred to as SOCi (0)) based on the relation between the SOC and the OCV illustrated in FIG. 4 is calculated from a stabilized voltage (OCV) at the time when the vehicle is activated (Expression 1B). A variation amount (hereinafter, referred to as ΔSOC (t)) of the SOC is calculated on the basis of a current integral value of the battery and a full-charged capacity of the battery (Expression (1C)). The SOCi(0) and ΔSOC(t) are added to calculate the SOCi(t) (Expression (1A)).

$$SOCi(t) = SOCi(0) + \Delta SOC(t) \tag{1A}$$

$$SOCi(0) = SOCMap(OCV(0)) \tag{1B}$$

$$\Delta SOC(t) = 100 \times \int (I(t)/Q\max) dt \tag{1C}$$

Herein, I is current [A], and Qmax is the full-charged capacity [Ah] of the cell 111. Since the SOCi obtains the ΔSOC on the basis of the integrated value of the current, an error contained in the current measured by the current detection unit 130 is accumulated as time goes. Therefore, there is a concern that an SOC calculation error is increased.

Figure 8:
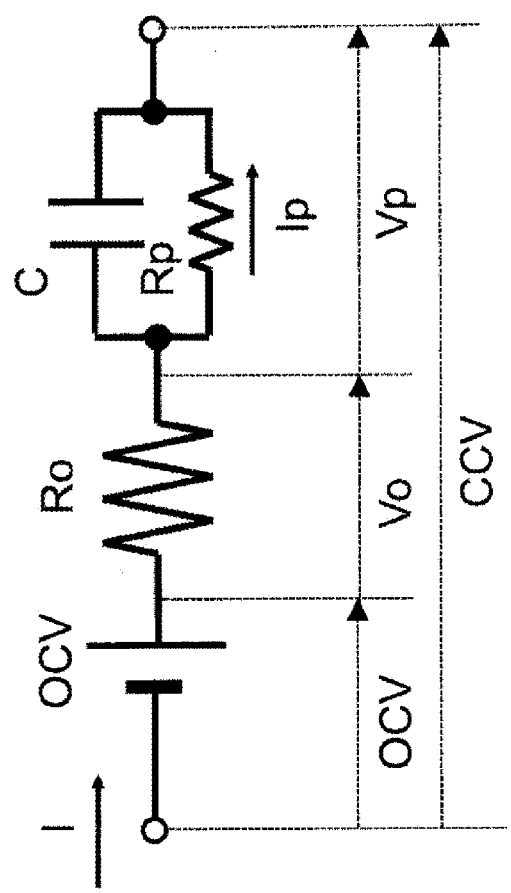
FIG. 8 is a diagram illustrating an example of an equivalent circuit model of the battery.

The calculation performed by the SOCv calculation unit 151-2 will be described on the basis of FIGS. 8 and 9. FIG. 8 illustrates an equivalent circuit model of the cell 111. The cell 111 can be modeled as an equivalent circuit in which a DC power source obtained by modeling the OCV indicating an open circuit voltage of the battery, Ro indicating a resistance component such as an electrode and an electrolyte, and a parallel circuit of Rp and C obtained by modeling a resistance component (polarized component) in accordance with an electrochemical reaction of the battery are connected in series.

The OCV can be represented by the following Expression (2A) from the equivalent circuit illustrated in FIG. 8. The OCV represented by Expression (2A) is called an estimated OCV.

$$OCV(t)=CCV(t)-(Vo(t)+Vp(t)) \quad (2A)$$

In this case, the CCV(t) is a close circuit voltage of the battery measured at an arbitrary time, the Vo(t) is a voltage variation based on the resistance component Ro, and these values are calculated by the following Expression (2A). The Vp(t) is a voltage variation (polarized voltage) based on the resistance component Rp, and calculated by the following Expression (2B).

$$Vo(t)=I(t) \times RoMap(SOC(t),T(t)) \quad (2B)$$

$$Vp(t)=Ip(t) \times RpMap(SOC(t),T(t)) \quad (2C)$$

$$SOCv(t)=SOCMap(OCV(t)) \quad (2D)$$

RoMap(SOC(t), T(t)) and RpMap(SOC(t), T(t)) contained in the above Expressions (2B) and (2C) are a data table stored in the storage unit 180 in advance, and Ro and Rp are each read out according to the SOC and the temperature. The OCV is calculated from the above Expressions (2A) to (2C), and the SOCv is calculated from the relation between the SOC and the OCV of FIG. 4 (Expression (2D)).

An error of the polarized component which is not able to be expressed by the parallel circuit of Rp and C (hereinafter, referred to as a polarization modeling error) and an influence of the polarization modeling error onto the SOCv calculation will be described on the basis of FIG. 9. Further, in FIG. 9, errors of the resistance component Ro and the OCV in the equivalent circuit model of FIG. 8 are not considered for the sake of simplicity in the explanation, and the description will be given only about a calculation error of the polarized voltage Vp and an error of the SOCv caused by the calculation error of the polarized voltage Vp. FIG. 9(*a*) illustrates a current waveform, FIG. 9(*b*) illustrates a voltage waveform, and FIG. 9(*c*) illustrates an SOC waveform.

Figure 9:
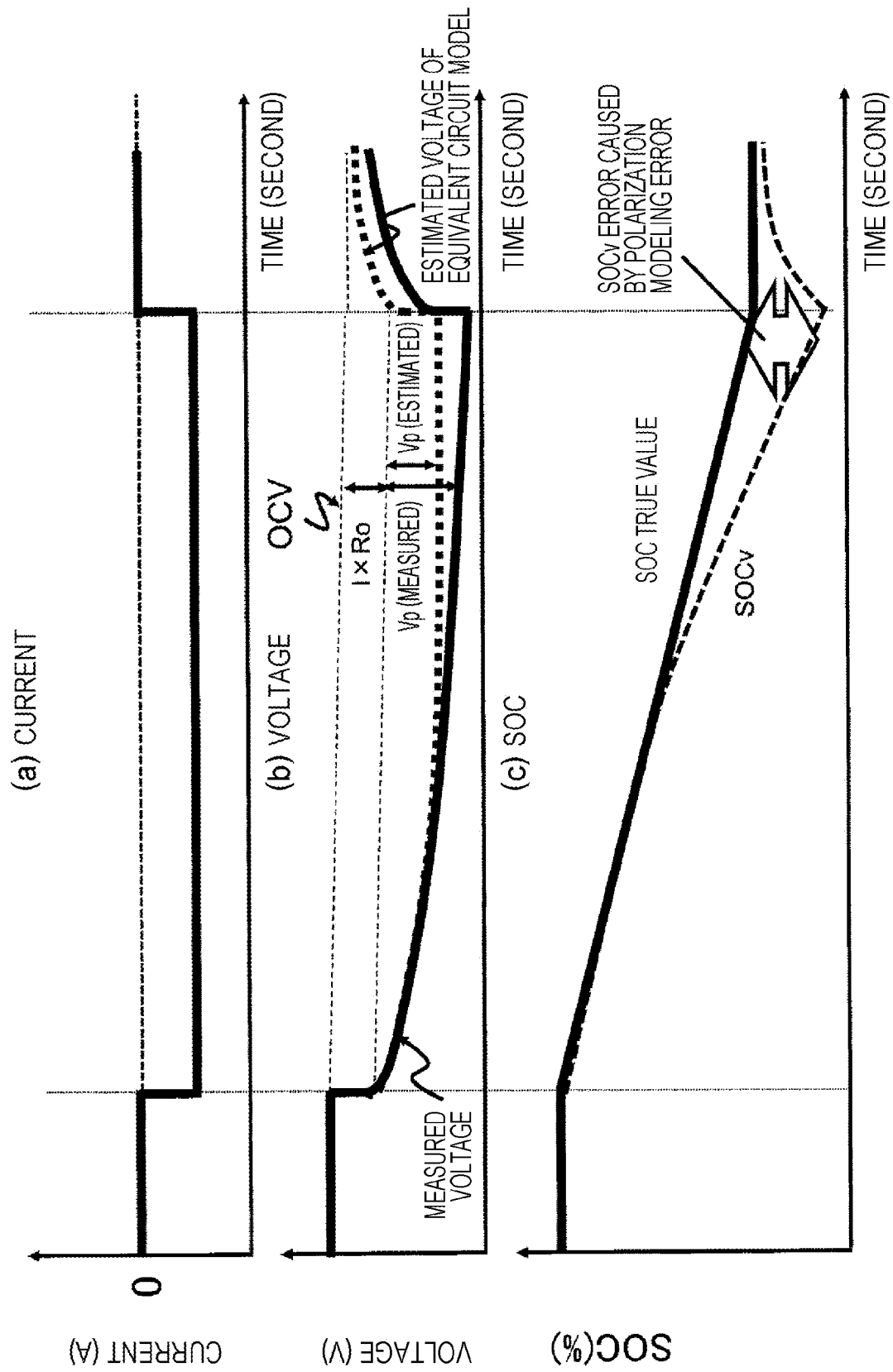
FIG. 9 is a diagram for describing an SOC calculation error caused by a modeling error of the equivalent circuit model of the battery (Part 1).

In a case where the current as illustrated in FIG. 9(*a*) flows to the battery (that is, a case where the battery is charging), a measured value of the battery voltage is gradually decreased by the voltage variation (polarized voltage) caused by the resistance component in accordance with the electrochemical reaction after the voltage variation occurs by the resistance component of the electrode and the electrolyte as illustrated by a solid line of FIG. 9(*b*). The line segment illustrated by a broken line of FIG. 9(*b*) illustrates a result in a case where the battery voltage is estimated using the equivalent circuit model of FIG. 8. It can be seen from FIG. 9(*b*) that there is a gap with respect to the measured voltage value illustrated by the solid line because it is not possible to model the polarized component which is complicated as a discharge continuing time increases. A degree of the gap with respect to the measured voltage value varies according to the state of the battery (for example, the temperature of the SOC and a degradation state), and varies even according to the charging/discharging pattern. Therefore, there is a need to model the polarized voltage with a high accuracy in order to estimate the polarized voltage with a high accuracy under any condition. However, there is a concern that a calculation process is complicated and the number of development processes is increased as the modeling of the polarized voltage is highly advanced.

Figure 10:
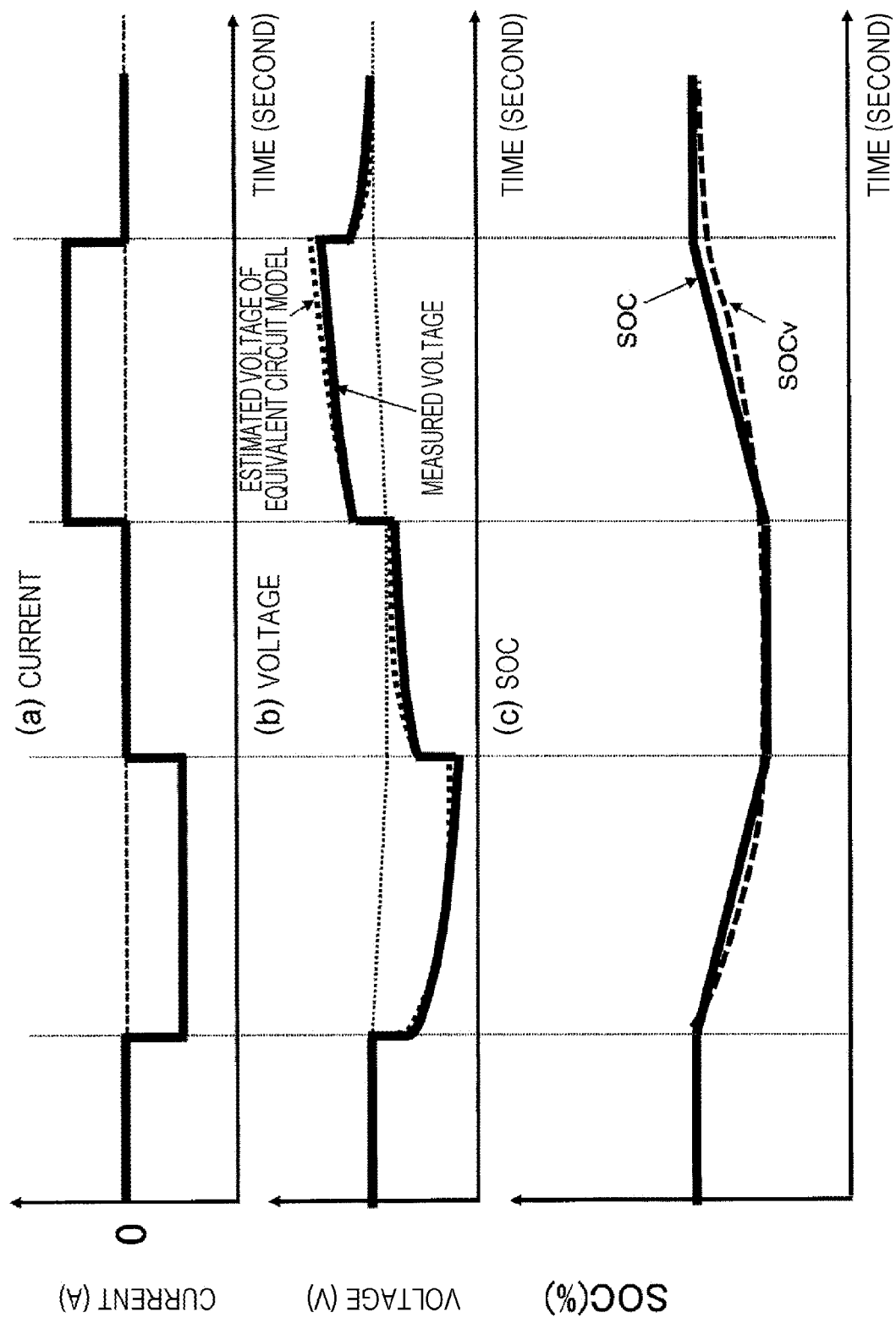
FIG. 10 is a diagram for describing an SOC calculation error caused by a modeling error of the equivalent circuit model of the battery (Part 2).

In the case of the example of FIG. 9, a voltage variation amount caused by the polarization is underestimated. Therefore, the calculation value of the OCV becomes small, and accordingly the SOCv is estimated as being small. On the other hand, FIG. 10 illustrates waveforms in a case where the discharging pulse and the charging pulse are alternately input. In a case where the polarization modeling error is small or the voltage variation amount caused by the polarization is small (for example, in a case where the polarization error generated at the time of charging and the polarization error generated at the time of discharging are canceled each other), the polarization modeling error is small. Therefore, the influence on the SOCv calculation is small, and the accuracy of the SOCv tends to be improved.

Figure 3:
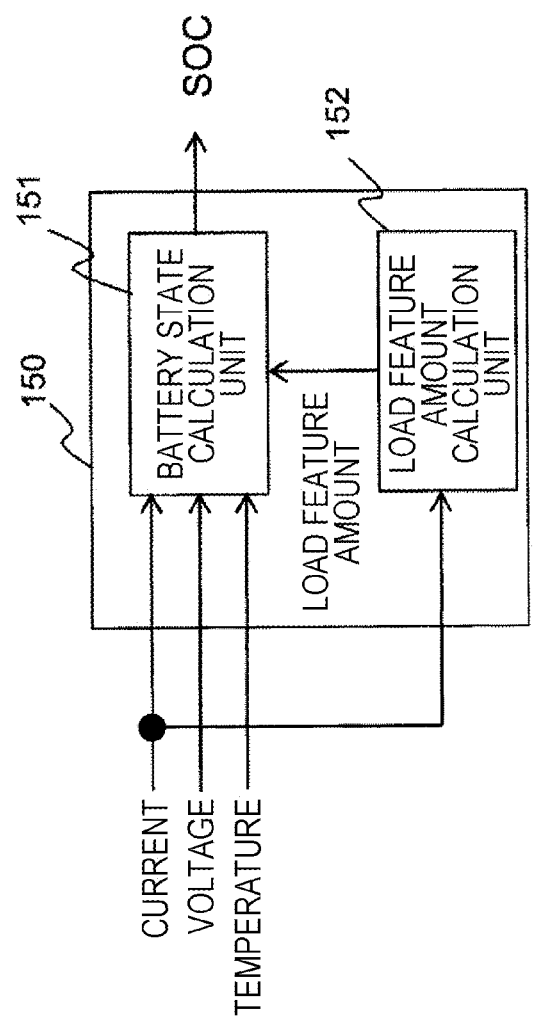
FIG. 3 is a block diagram illustrating a battery pack control unit of the battery system of FIG. 1.

In this embodiment, the feature of the SOCv error illustrated in FIGS. 9 and 10 is grasped by the load feature amount calculation unit 152 described in FIG. 3, and a combination calculation of the SOCi and the SOCv is performed according to the feature.

The combination calculation unit 151-3 determines a weighting coefficient w according to the load feature amount calculated by the load feature amount calculation unit 152, and the SOC (t) is calculated by the following Expression (3) on the basis of the determined weighting coefficient w.

$$SOC(t)=(1-w(t)) \times SOCv(t)+w(t) \times SOCi(t) \quad (3)$$

A method of determining the weighting coefficient w will be described below together with a processing content in the load feature amount calculation unit 152.

The calculation of the load feature amount calculation unit 152 will be described on the basis of FIGS. 11 to 15. The load feature amount calculation unit 152 calculates the load feature amount on the basis of the current value flowing to the battery. In this embodiment, a discharging count rate is used as the load feature amount.

Figure 11:
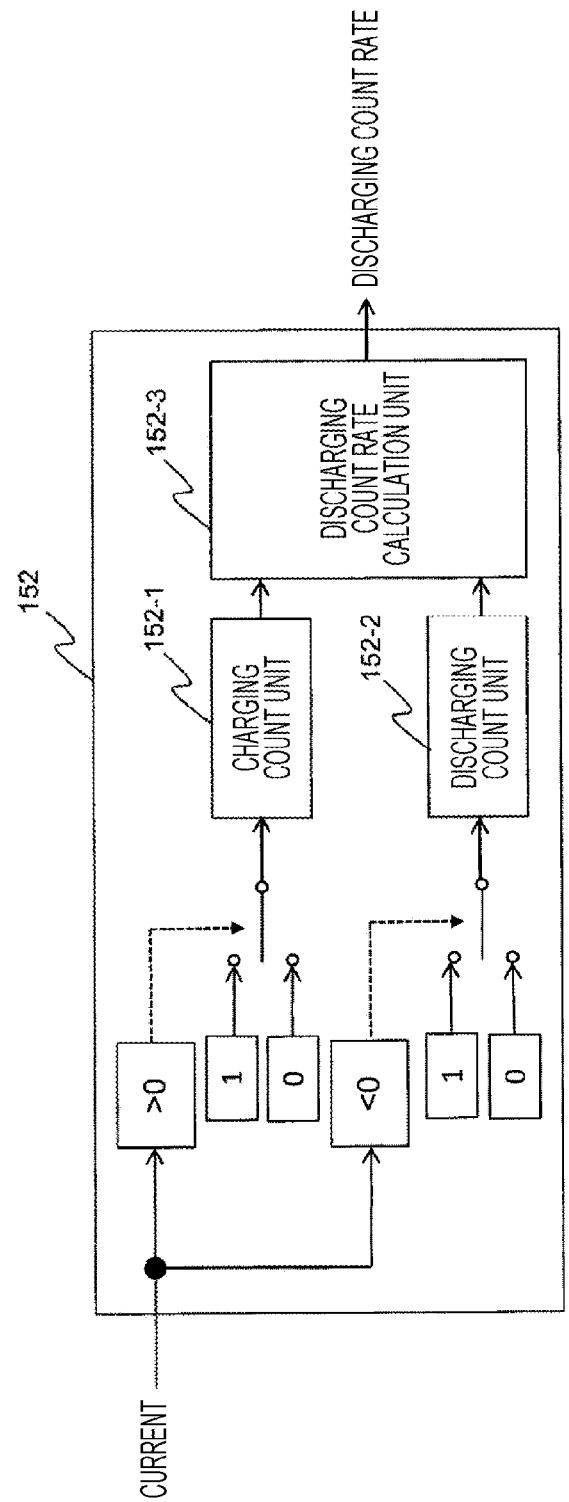
FIG. 11 is a block diagram illustrating an example of a function of a load feature amount calculation unit.

FIG. 11 is a functional block diagram of calculating the discharging count rate which is the load feature amount of the first embodiment. The discharging count rate is a relative rate obtained by counting the number of times of charging and the number of times of discharging of the current flowing to the battery and by taking the number of time of discharging with respect to the number of times of current flowing over a certain time width Tw (period from the current time point before Tw seconds). Specifically, the discharging count rate is calculated by the following Expression (4).

Discharging count rate=Number of times of discharging/(Number of times of charging+Number of times of discharging) (4)

Figure 12:
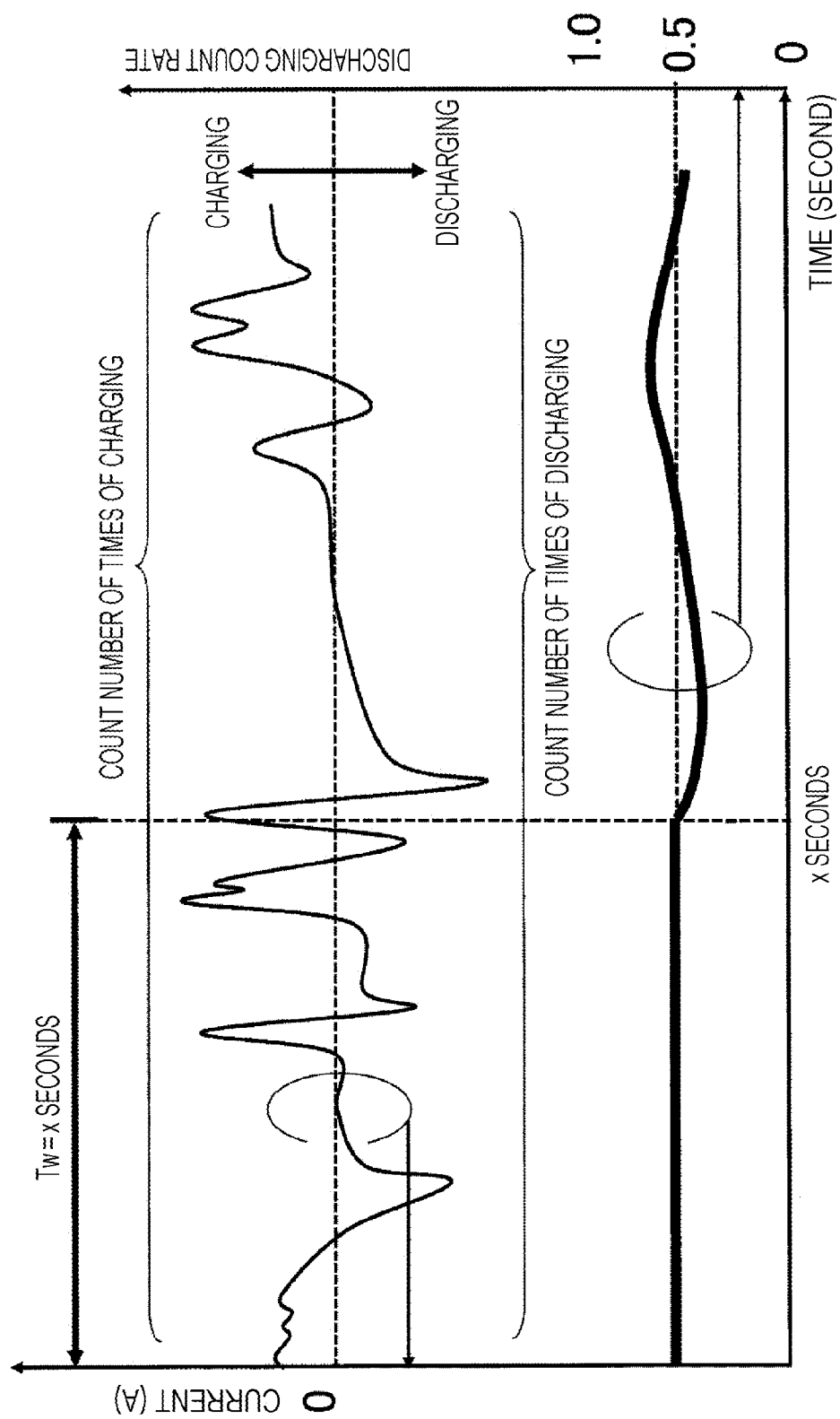
FIG. 12 is a diagram for describing a discharging count rate.

In Expression (4), when the number of times of charging and the number of times of discharging are equal, the discharging count rate becomes 0.5. When the number of times of discharging is large, the discharging count rate becomes a value larger than 0.5. When the number of times of charging is large, the discharging count rate becomes a value smaller than 0.5. In other words, the discharging count rate becomes a value larger than 0.5 in a case where the discharging as illustrated in FIG. 9 continues in the time window Tw. In a case where the charging current and the discharging current as illustrated in FIG. 12 flow alternately, the discharging count rate becomes a value near 0.5.

The weighting coefficient w of the above Expression (3) is calculated on the basis of the calculated discharging count rate. A method of setting the weighting coefficient w will be described with reference to FIG. 13.

Figure 13:
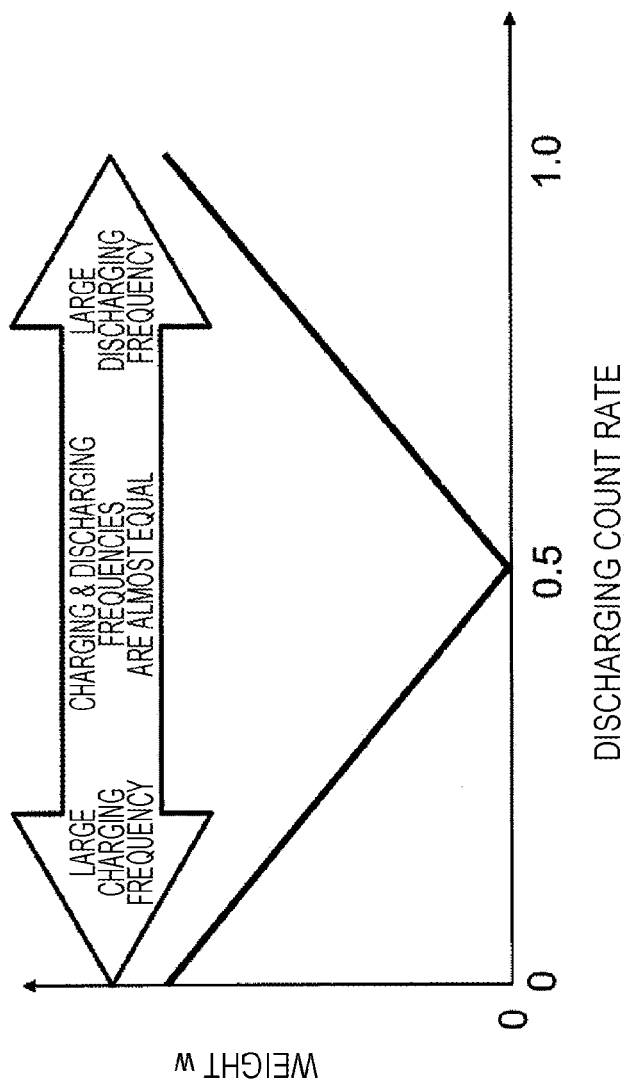
FIG. 13 is a diagram illustrating a weighting coefficient corresponding to the discharging count rate.

As described above, in a case where the discharging count rate is near 0.5, it means a condition in which the charging and discharging frequencies are almost equal and the SOCv calculation accuracy is suitable. On the other hand, the discharging count rate larger than 0.5 is a condition in which the discharging frequency is high, and the discharging count rate smaller than 0.5 is a condition in which the charging frequency is high. In both cases, the influence of the polarized voltage becomes large. Then, as illustrated in FIG. 13, in a case where the discharging count rate is near 0.5, the weighting coefficient w is set to make a weight with respect to the SOCv large.

Specifically, in a case where the discharging count rate is 0.5, the weighting coefficient w is set to "0", and the SOC calculation result employs the SOCv by Expression (3). On the other hand, when the charging/discharging frequency is high (for example, in a case where the discharging count rate is 1.0 or 0), the weighting coefficient w is set to 1.0. The SOCi is employed, and it is possible to avoid the influence of a calculation error of the SOCv.

Further, the weighting coefficient w is set to gradually increase from 0 to 1 when the discharging count rate is in a range from 0.5 to 1.0 and a range from 0.5 to 0.

As illustrated in FIG. 12, the discharging count rate is calculated on the basis of the number of times of discharging and the number of times of charging in the time window Tw. However, when the SOC is calculated in the time window Tw to calculate the discharging count rate, the discharging count rate is set to 0.5 (that is, the weighting coefficient w is set to 0). After the time window Tw elapses, the SOC is calculated using the weighting coefficient w calculated in the previous time window Tw until it reaches a next sampling start time point of data for calculating the discharging count rate.

The discharging count rate is updated after an arbitrary time width Tw elapses. In other words, the discharging count rate is updated by a discharging count rate calculated in the previous time width Tw at every start of the time width Tw.

However, in order to simplify the explanation, the following description will be given in an assumption that the discharging count rate is 0.5, and the SOCi is employed as the output of the SOC calculation value until the time width Tw elapses.

Figure 14:
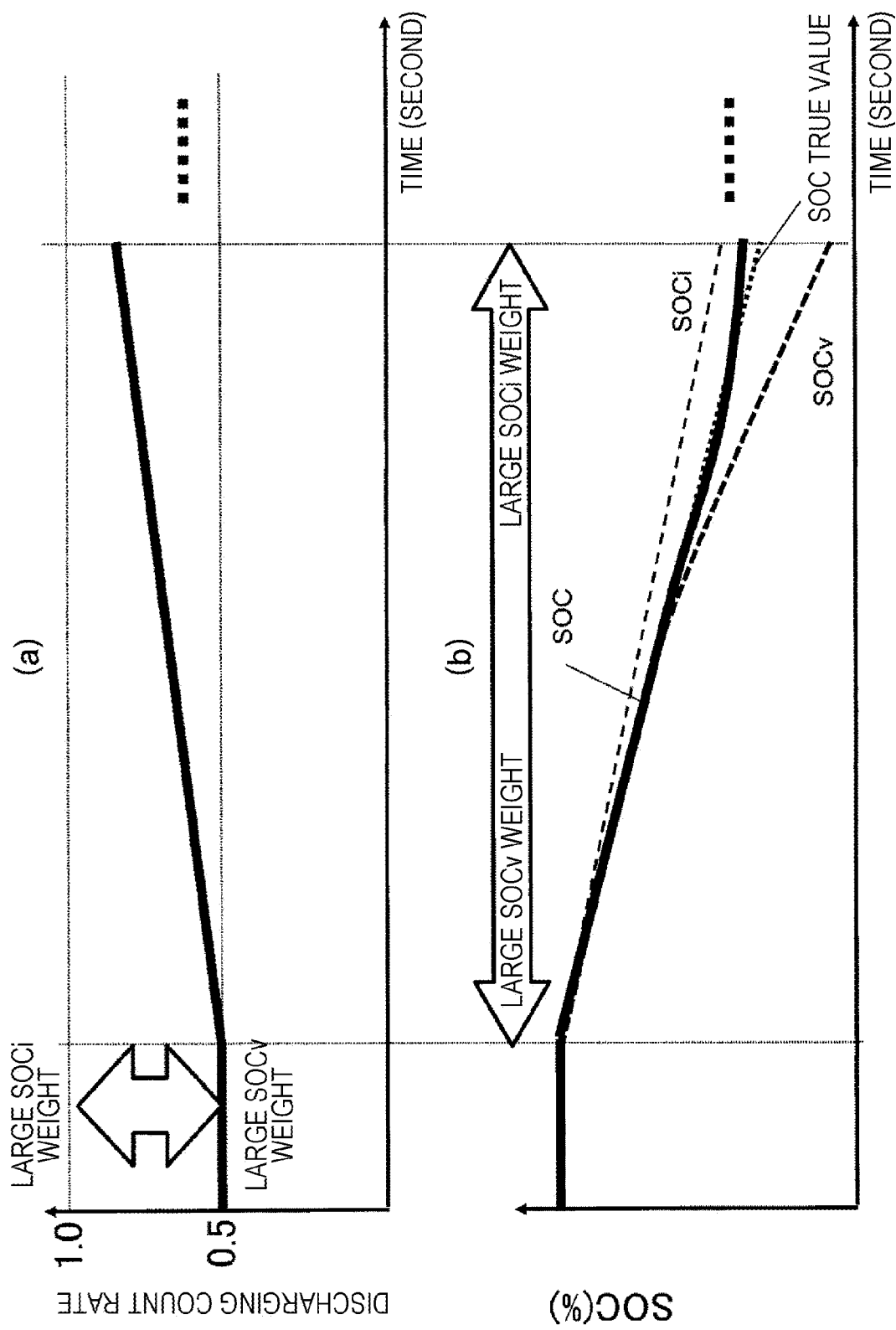
FIG. 14 is a diagram for describing an effect of the first embodiment.

FIG. 14 is an example of a result of calculating the SOC according to this embodiment when a pulse current flows as illustrated in FIG. 9(a) (that is, when discharging).

Since the discharging current flows continuously, the discharging count rate is increased as time goes as illustrated in FIG. 14 (a). When the relation between the discharging count rate and the weighting coefficient is applied as illustrated in FIG. 13, and in a case where the discharging count rate is near 0.5, the weighting coefficient w becomes a small value to increase the weight with respect to the SOCv. As the discharging count rate approaches 1.0, the weighting coefficient w becomes a large value to increase the weight with respect to the SOCi.

FIG. 14(b) illustrates waveforms of the SOC calculation result when the discharging count rate changes as illustrated in FIG. 14(a). The thin broken line illustrated in FIG. 14 (b) indicates the SOCi calculation result, the thick broken line indicates the SOCv calculation result, and the solid line indicates the SOC calculation result which is calculated by combining the SOCi and the SOCv.

In a case where this embodiment is applied, the SOC calculated by weighting average becomes a waveform passing between the SOCi and the SOCv. In other words, when the weighting coefficient w is set to 0 at the time when the discharging starts, the SOCv becomes the SOC calculation value. Thereafter, the weighting coefficient w is increased gradually as the discharging count rate increases, the weight with respect to the SOCi is increased when the continuous discharging time elapses, and the calculation result containing a lot of SOCi components becomes the SOC calculation value. Therefore, the region where the influence of the polarization modeling error is strong to decrease the accuracy of the SOCv can be covered by the SOCi. As a result, it is possible to calculate the SOC with a high accuracy.

The battery control device 190 of the first embodiment achieves the following operational effects. (1) The battery control device 190 includes: the load feature amount calculation unit 152 which calculates a feature amount indicating the charging/discharging pattern of the battery (for example, the discharging count rate); a first charging state amount calculation unit 151-1 which calculates a first charging state amount SOCi of the battery on the basis of the first battery state amount such as a current, a voltage, and a full-charged capacity; a second charging state amount calculation unit 151-2 which calculates a second charging state amount SOCv of the battery on the basis of the second battery state amount such as a current and a voltage; and a third charging state amount calculation unit 151-3 which calculates a third charging state amount SOC on the basis of the feature amount, the first charging state amount, and the second charging state amount.

In the battery control device 190 of the first embodiment, the third charging state amount SOC is calculated as described below. The first charging state amount SOCi is calculated by the first battery state amount, and the second charging state amount SOCv is calculated by the second battery state amount. The charging/discharging feature amount is calculated according to the charging/discharging pattern, and the third charging state amount SOC is calculated on the basis of the feature amount, the first charging state amount SOCi, and the second charging state amount SOCv. The first charging state amount SOCi and the second charging state amount SOCv contain an error component, and the amount of the error component depends on the charging/discharging pattern. Then, the third charging state amount calculation unit 152-3 combines the first charging state amount SOCi and the second charging state amount SOCv to suppress the error component using the feature amount based on the charging/discharging pattern.

According to the first embodiment, it is possible to calculate the SOC with a high accuracy by combining the first charging state amount SOCi and the second charging state amount SOCv on the basis of the feature amount of the charging/discharging pattern. As a result, the reliability of the electric motor vehicle system 800 can be secured and the battery can be used efficiently, so that the battery can be used for a long lifespan.

(2) The load feature amount calculation unit 152 calculates the weighting coefficient w with respect to the first charging state amount SOCi and the second charging state amount SOCv of the battery on the basis of the calculated feature amount. The third charging state amount calculation unit 151-3 combines the first charging state amount SOCi and the second charging state amount SOCv with the weighting coefficient w using a combination arithmetic expression (for example, Expression (3)) to calculate the SOC which is the third charging state amount. The second charging state amount SOCv contains a less error component when the charging/discharging current is in balance. In a case where the feature amount of the charging/discharging pattern indicates that the charging/discharging current is in balance (for example, in a case where the discharging count rate is 0.5), the weighting coefficient w is determined such that a ratio of the second charging state amount SOCv is large on the basis of the SOC combination calculation result of the third charging state amount calculation unit 151-3.

The weighting coefficient w is calculated from the feature amount of the charging/discharging pattern so as to perform the combination calculation of the first charging state amount SOCi and the second charging state amount SOCv. In other words, the charging/discharging pattern is converted into a feature amount such as the weighting coefficient, and one of the first charging state amount SOCi and the second charging state amount SOCv is determined to assign a weight. As a result, an influence of the charging/discharging pattern onto the error of the SOCi can be verified. The weighting coefficient w can be set according to the verification result, and it is possible to satisfy various battery characteristics with speed.

(3) The load feature amount calculation unit 152 calculates a frequency of the charging/discharging (for example, the discharging count rate) on the basis of a ratio of the number of times of charging and the number of times of discharging of the battery, and calculates the weighting coefficient w on the basis of the discharging count rate. When the discharging count rate is 0.5, the charging/discharging current is in balance, so that the error component of the second charging state amount SOCv is small. In the first embodiment, the weighting coefficient w is set to zero when the discharging count rate is 0.5. The third charging state amount calculation unit 151-3 performs a combination calculation in which the second charging state amount SOCv becomes the SOC calculation value by the weighting coefficient w (zero).

Since the charging/discharging pattern is defined as a ratio of the number of times of discharging and the number of times of charging, it is possible to simply capture the feature amount of the charging/discharging pattern using a signal of a current sensor. In other words, an SOC calculation accuracy can be improved using the existing sensor.

(4) A voltage value used by the first charging state amount calculation unit 151-1 is an open circuit voltage which is measured at the time of operation at which the charging/discharging current is smaller than a predetermined value. In the first embodiment, the open circuit voltage OCV measured at the time when the vehicle is activated is used. In addition, a voltage value used by the second charging state amount calculation unit 151-2 is an estimated open circuit voltage which is estimated on the basis of the close circuit voltage CCV measured at the time of operation at which the charging/discharging current is equal to or more than a predetermined value. In the first embodiment, the equivalent circuit model illustrated in FIG. 8 is employed, and an estimated open circuit voltage OCV is calculated by Expressions (2A) to (2C). Expression (2B) represents the voltage variation Vo(t) which is caused by Ro indicating the resistance component such as an electrode and an electrolyte. Expression (2C) represents the voltage variation (polarized voltage) Vp(t) which is caused by the resistance component (polarized component) Rp in accordance with an electrochemical reaction of the battery.

In both of the calculation of the first charging state amount SOCi and the calculation of the second charging state amount SOCv, the SOC is calculated on the basis of a result obtained by detecting the open circuit voltage OCV, or calculating the OCV without using a highly-advanced polarization model. Therefore, the calculation algorithm is not complicated.

—Modification of the First Embodiment—

Figure 15:
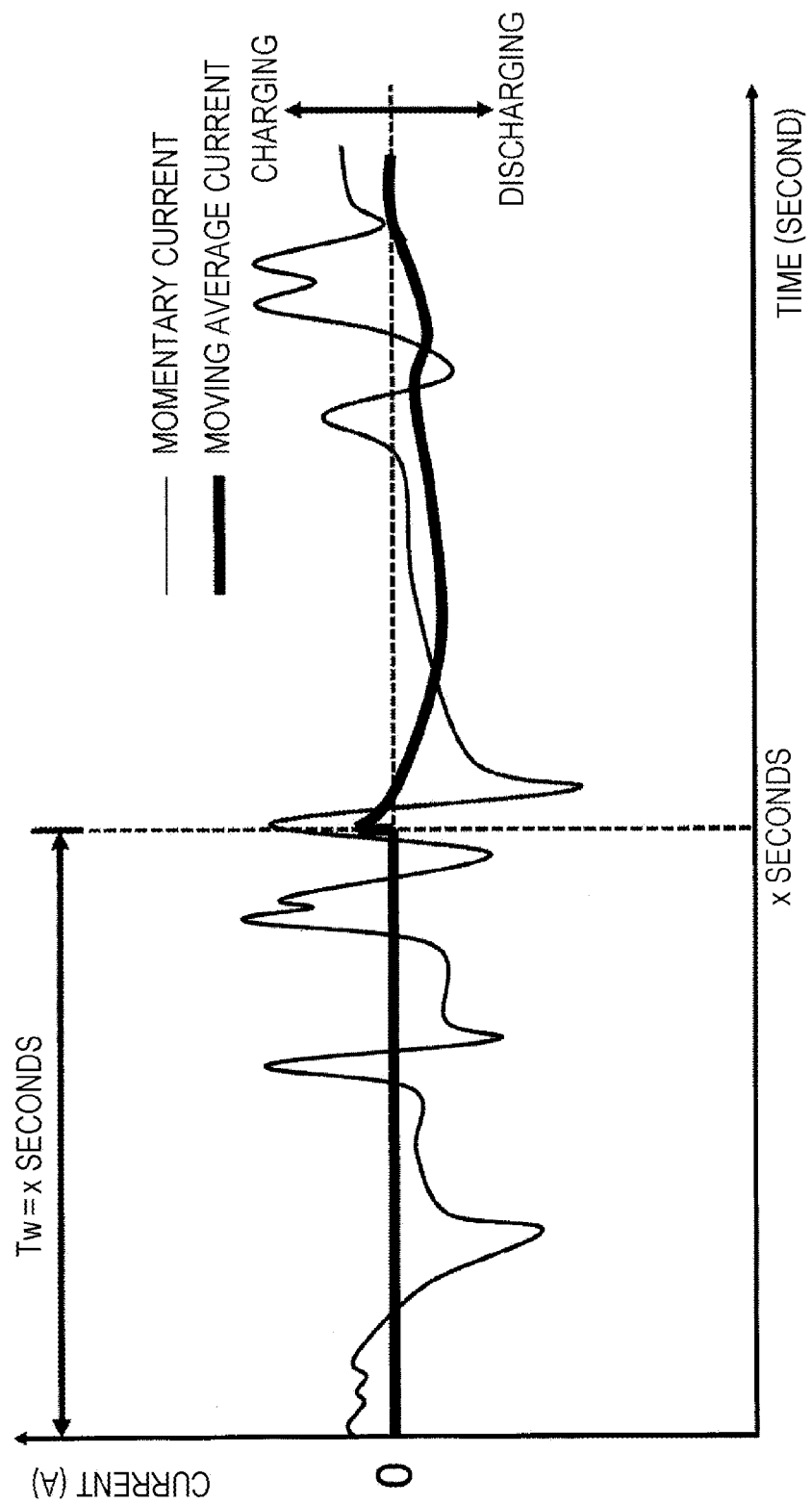
FIG. 15 is a diagram illustrating a transition of a moving average current.

FIG. 15 is a diagram illustrating a modification of the first embodiment. The first embodiment has been described such that the weighting coefficient w is set as illustrated in FIG. 13 on the basis of the discharging count rate, and the weights of the SOCv and the SOCi are combined as illustrated in Expression (3) using the set weighting coefficient w so as to calculate the SOC. The calculation of the weighting coefficient w is not limited to the above method. For example, as illustrated in FIG. 15, the weighting coefficient w may be obtained on the basis of the current value obtained by taking a moving average of the battery current.

When a moving average current value is negative, it indicates that the battery is discharged during the calculation time. When the moving average current value is positive, it indicates that the battery is charged during the calculation time. When the moving average current value is zero, the charging/discharging current of the battery during the calculation time is in balance as described in FIG. 10. Therefore, the weighting coefficient w at the time when the moving average current value is zero is set to "0". The weighting coefficient w is set to "1" when an absolute value of the moving average current value is a predetermined value. The weighting coefficient w is gradually increased from "0" to "1" during a period when the moving average current value reaches a predetermined value from "0".

In this modification, the weighting coefficient w is calculated on the basis of an average current value obtained by performing a moving average process on the current in place of the discharging count rate. Similarly to the first embodiment in which the weighting coefficient w is calculated on the basis of the ratio of the number of times of discharging and the number of times of charging in a predetermined time period, the feature amount of the charging pattern can be captured only by the current sensor. In addition, the battery can be efficiently used at a low cost, so that the lifespan can be improved. It is possible to provide an electric motor vehicle having a high reliability by mounting the battery control device 190 on the electric motor vehicle system 800.

Second Embodiment

A second embodiment of the invention will be described on the basis of FIGS. 16 to 19. Further, an exemplary configuration of the electric motor vehicle system 800 of the plug-in hybrid electric vehicle in this embodiment is similar to that of the first embodiment illustrated in FIG. 1, and the description will be given focusing on a difference from those of the first embodiment.

Figure 16:
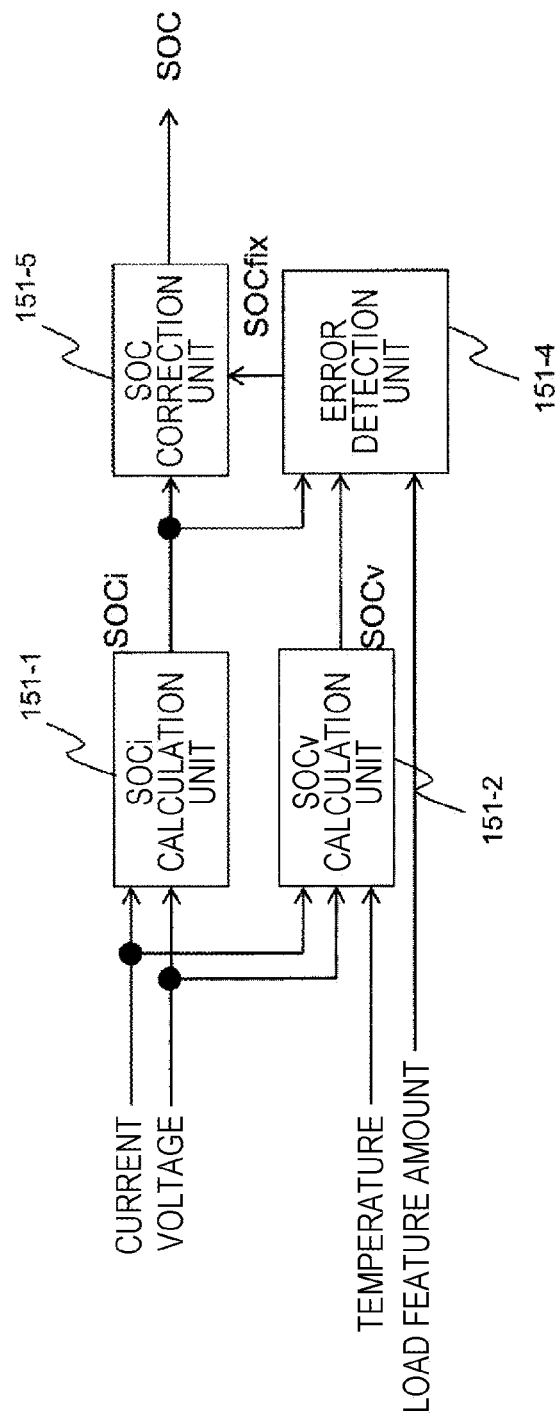
FIG. 16 is a block diagram illustrating the battery state calculation unit in a second embodiment.

The battery state calculation unit 151 in the second embodiment will be described on the basis of FIG. 16.

The battery state calculation unit 151 in the second embodiment includes the SOCi calculation unit 151-1, the SOCv calculation unit 151-2, an error detection unit 151-4, and an SOC correction unit 151-5. The second embodiment is different from the first embodiment in that the error detection unit 151-4 and the SOC correction unit 151-5 are provided in place of the combination calculation unit 151-3. The error detection unit 151-4 calculates an SOC correction amount (SOCfix) on the basis of the SOCi, and SOCv, and the load feature amount. The SOC correction unit 151-5 corrects the SOCi calculated by the SOCi calculation unit 151-1 using the SOCfix calculated by the error detection unit 151-4 to calculate the SOC.

The error detection unit 151-4 calculates a difference SOCfix between the SOCi and the SOCv in a case where a condition that the SOCv calculation accuracy is preferable is determined on the basis of the load feature amount (for example, the discharging count rate described in the first embodiment). The condition that the SOCv calculation accuracy is preferable is a condition in which the charging/discharging current is in balance such that an integration count rate is 0.5 for example.

The SOC correction unit 151-5 corrects the SOCi by the following Expression (5) using the SOC correction amount SOCfix which is the output from the error detection unit 151-4.

$$SOC(t)=SOCi(t)+SOCfix(t) \quad (5)$$

The operational effect of the second embodiment will be described on the basis of FIGS. 17 to 19.

Figure 17:
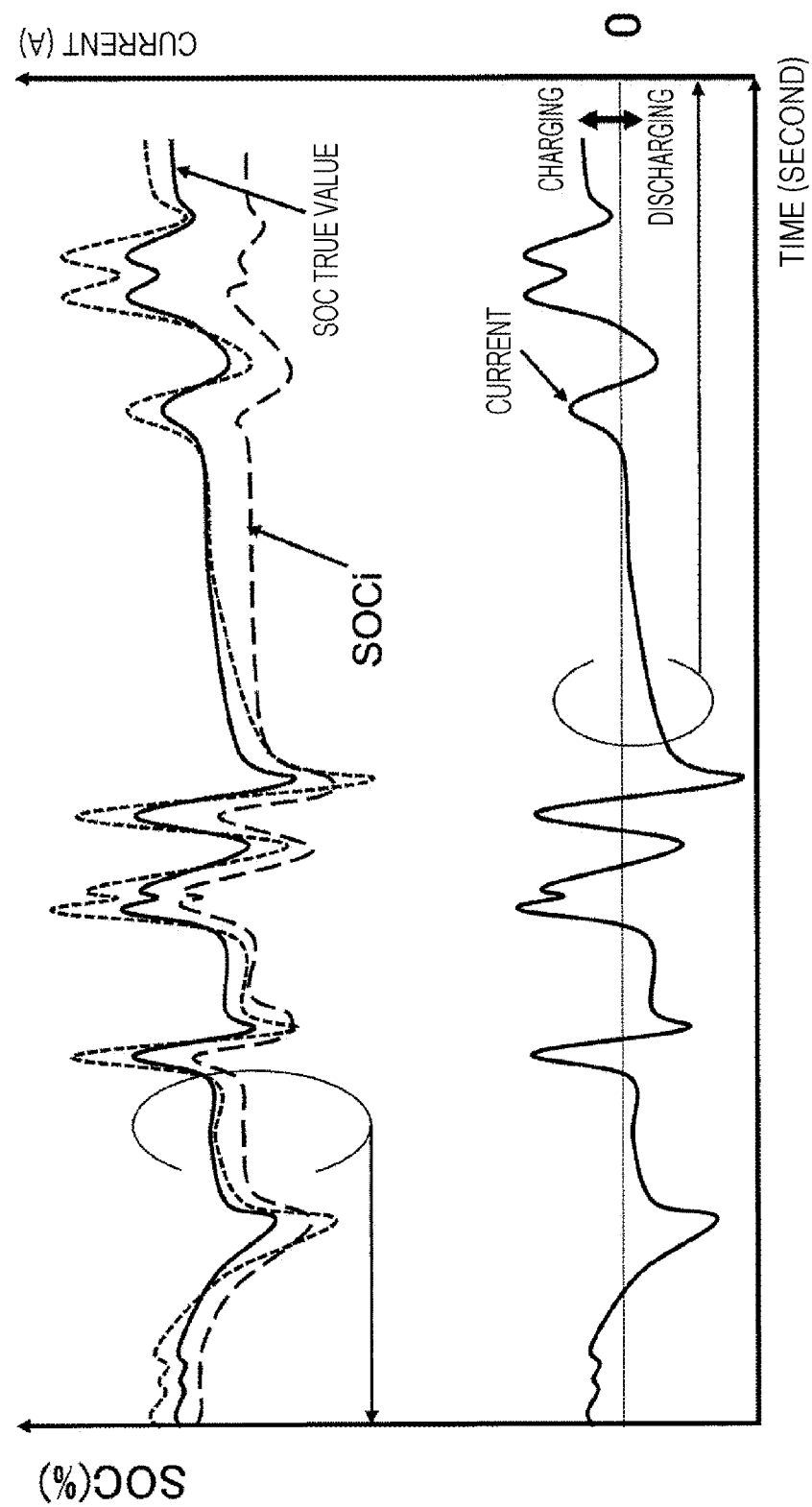
FIG. 17 is a diagram illustrating an exemplary result of calculating a current-based SOC and a voltage-based SOC with respect to an arbitrary current waveform.

FIG. 17 illustrates calculation results of an SOC true value, the SOCi, and the SOCv in a case where an arbitrary current waveform is input. FIG. 18 is a graph in which the current waveform illustrated in FIG. 17 is replaced to the discharging count rate in an arbitrary time window Tw described in the first embodiment. FIG. 19 illustrates waveforms of the SOC calculation result in a case where an SOCi correction process is applied on the basis of the discharging count rate.

Figure 18:
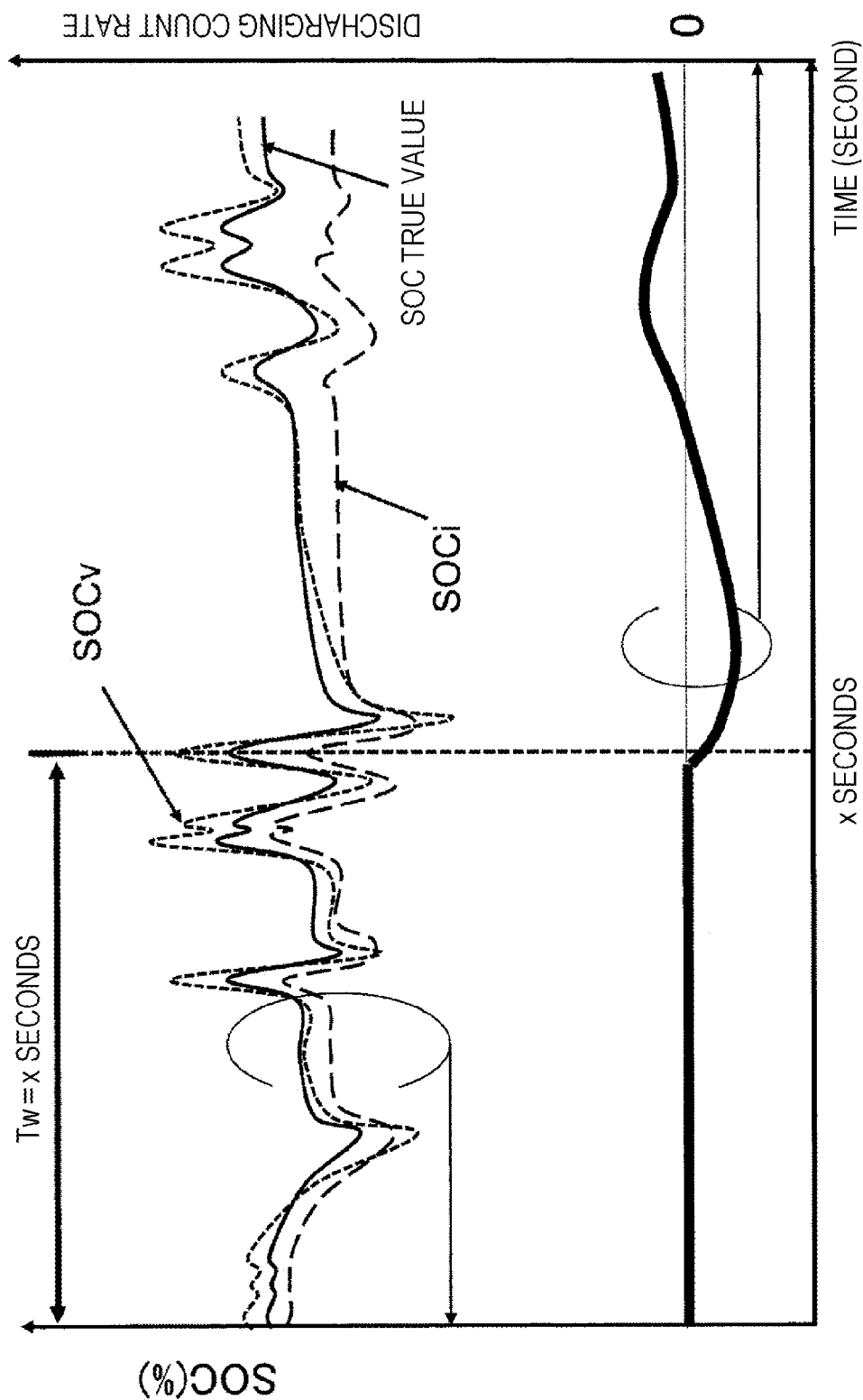
FIG. 18 is a diagram illustrating a relation between the discharging count rate corresponding to an arbitrary current waveform and a result of calculating the current-based SOC and the voltage-based SOC.
Figure 19:
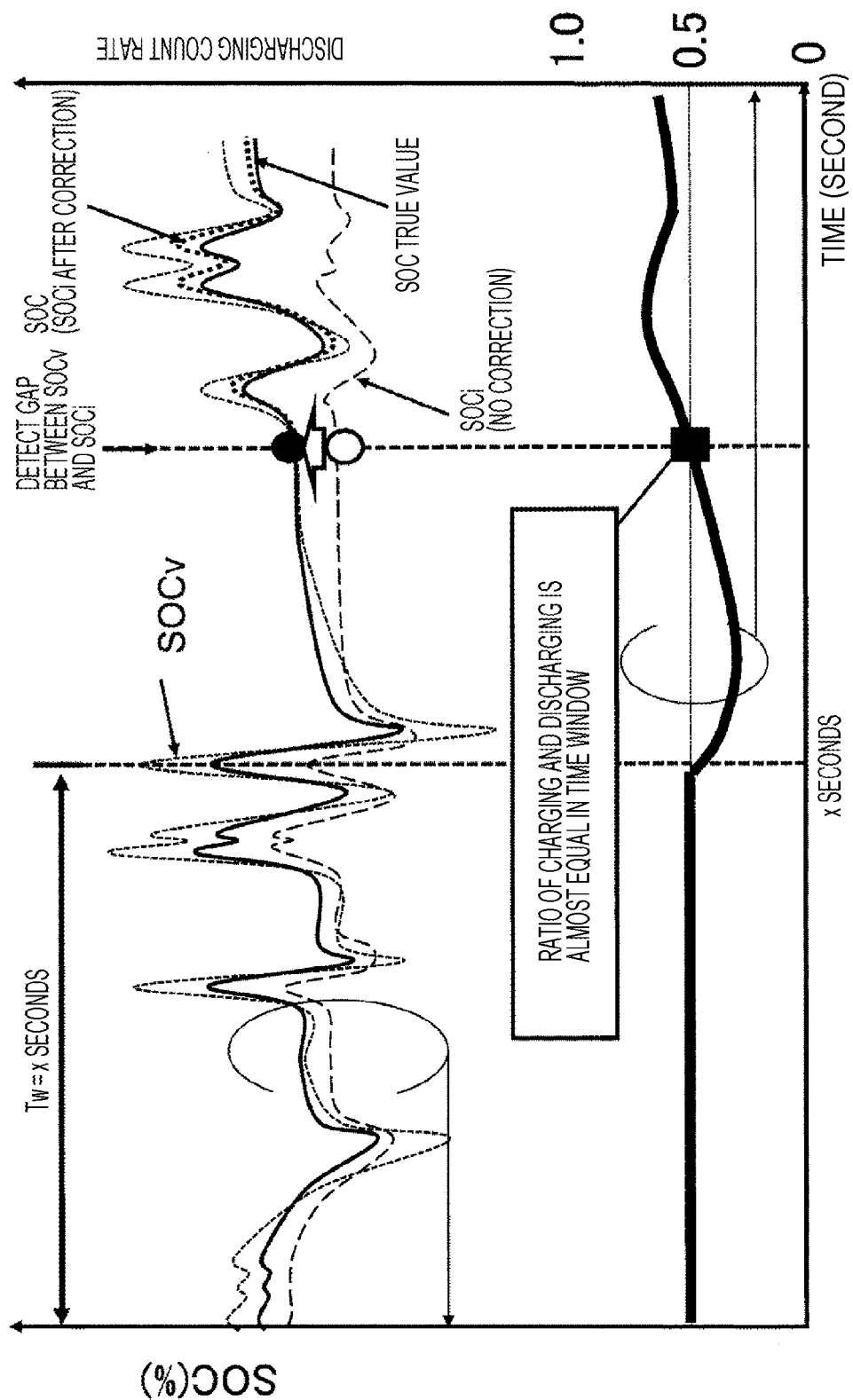
FIG. 19 is a diagram for describing an effect of the second embodiment.

The following tendency can be seen from FIGS. 17 and 18.

(1) Since the SOCi is integrated together with the current error by the current integration process as described even in the first embodiment, the SOCi error tends to increase as time goes.

(2) Since the SOCv is different in the SOCv calculation accuracy according to the discharging count rate as described even in the first embodiment, the accuracy can be secured in the vicinity of a discharging count rate of 0.5. However, the accuracy tends to decrease as the discharging count rate approaches "0" or "1".

An exemplary application of an SOC correction process in the second embodiment will be described on the basis of FIG. 19. Herein, for the sake of simplicity in explanation, the correction process is performed in a case where the discharging count rate becomes 0.5, and the difference between the SOCi and the SOCv itself is used as a correction amount.

After an arbitrary time Tw elapses, the discharging count rate is updated. In a case where the discharging count rate becomes 0.5 after updating, the difference between the SOCi and the SOCv is calculated, and the SOCi is corrected on the basis of the difference amount. Herein, since the difference amount between the SOCi and the SOCv itself is used as the correction amount, the SOC calculation result calculated by Expression (5) when the discharging count rate becomes 0.5 comes to be equal to the SOCv. Therefore, an accumulated value of the current error accumulated so far is reset when the discharging count rate becomes 0.5, and it can be seen that the SOC can be calculated with a high accuracy compared to the SOCi calculation value of the previous correction process.

According to the second embodiment, the same operational effect as that of the first embodiment can be achieved. In addition, the difference amount between the SOCi and the SOCv is calculated when the charging/discharging current is in balance is calculated, and difference amount is stored as the correction amount, and the SOC can be calculated by the correction amount. Therefore, the accumulated error contained in the SOCi calculated by the current integration method described in Expressions (1A) to (1C) is corrected by the difference.

—Modification of the Second Embodiment—

In the second embodiment, the difference amount SOCfix between the SOCi and the SOCv itself is used as the SOC correction amount. However, the invention is not limited to the above configuration. Hereinafter, a correction amount determining method other than the method of using the difference amount between the SOCi and the SOCv itself will be described as an example.

The difference amount between the SOCi and the SOCv contains an error of the SOCv itself caused by a voltage error and a current error. Therefore, the correction amount is estimated in advance according to the difference amount between the SOCi and the SOCv in consideration of the SOCv error, and the estimated correction amount is mounted as a map.

According to such a calculation method, the correction can be made in consideration of the influence of the error contained in the SOCv itself.

In addition, the SOC correction amount may be set according to the load feature amount. Assuming that the discharging count rate described in the first embodiment is applied as the load feature amount, in a case where the discharging count rate is "0.5", the correction amount is set to be large. In a case where the discharging count rate approaches "0" or "1", the correction amount is set to be small. Therefore, it is possible to determine an appropriate correction amount according to the discharging count rate.

Third Embodiment

A third embodiment of the invention will be described on the basis of FIGS. 20 to 23. Further, an exemplary configuration of the electric motor vehicle system 800 of the plug-in hybrid electric vehicle in this embodiment is similar to that of the first embodiment illustrated in FIG. 1, and the description will be given focusing on a difference from the first and second embodiments.

In the system of the third embodiment, the charging/discharging pattern of the battery is monitored. When overcharging or overdischarging, a drive control of the inverter and the motor is changed to adjust the balance of the charging/discharging current. For example, when the weight with respect to the SOCi is kept large in a mode such as an EV driving mode where the charging is primary, the inverter and the motor are controlled to increase the distribution of the regeneration (charging) so as to adjust the balance between the charging current and the discharging current.

In the first and second embodiments, the description has been given about the SOC calculation method in which the load feature amount (for example, the discharging count rate) is calculated from the charging/discharging pattern, and the SOCv having a preferable calculation accuracy is used in a case where the load feature amount is a predetermined value (for example, the discharging count rate is 0.5).

In the third embodiment, the description will be given on an assumption that the calculation method described in the second embodiment is used for the SOC calculation in the battery state calculation unit 151. In other words, when the charging/discharging current is in balance (for example, when the discharging count rate is 0.5), the difference between the SOCv and the SOCi is calculated, and a result obtained by correcting the SOCi using the difference ΔSOC is used as the SOC calculation value.

In the third embodiment, for example, the vehicle control unit 200 or the motor/inverter control unit 420 controls the charging/discharging of the battery system 100 such that the discharging count rate approaches "0.5" (that is, the SOCv calculation accuracy becomes preferable). As described above, the third embodiment is different from the first and second embodiments in that the charging/discharging pattern is controlled such that the SOC calculation accuracy becomes preferable.

Figure 20:
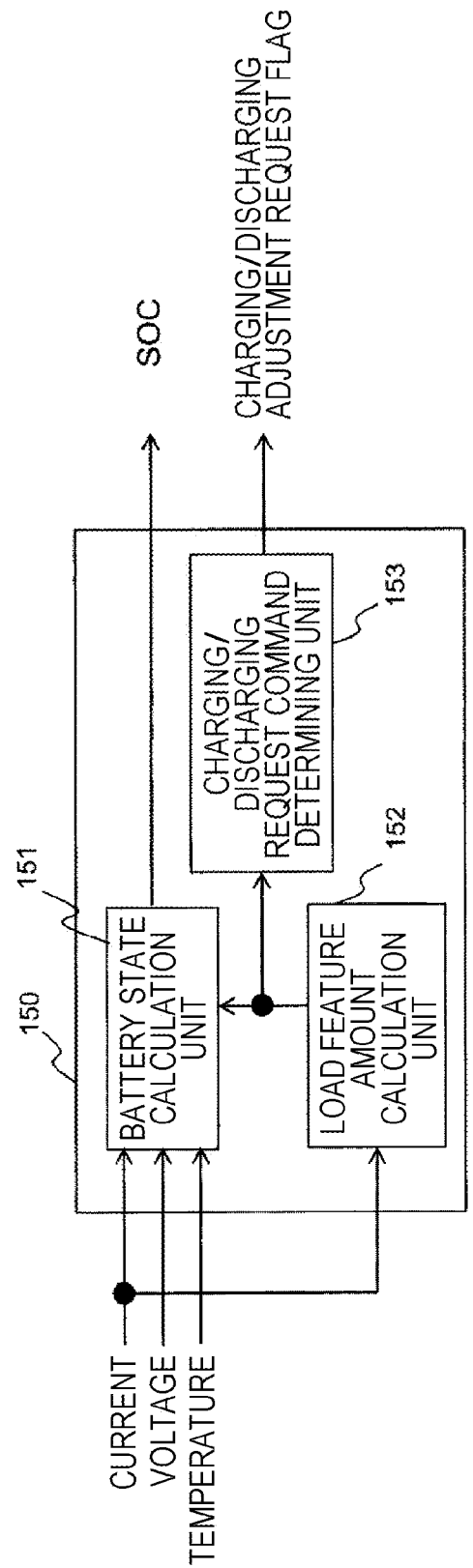
FIG. 20 is a block diagram illustrating the battery pack control unit in a third embodiment.

FIG. 20 illustrates the battery pack control unit 150 in the third embodiment.

The battery pack control unit 150 includes the battery state calculation unit 151 and the load feature amount calculation unit 152 similarly to the first embodiment, and further includes a charging/discharging request command determining unit 153. The charging/discharging request command determining unit 153 outputs a charging/discharging adjustment request flag on the basis of the load feature amount output from the load feature amount calculation unit 152. The charging/discharging adjustment request flag is input to the vehicle control unit 200 together with a state detection result such as the SOC and the power which can be input/output to/from the battery system 100.

When it is determined that the charging/discharging does not need to be adjusted, the charging/discharging adjustment request flag is set to "0" according to the load feature amount, and, when determined to be needed, set to a value corresponding to the state of the charging/discharging. For example, in a case where a state that the discharging count rate described in the first and second embodiments is "0" or "1.0" as the load feature amount (that is, a state that the charging/discharging pattern deviated to the charging or the discharging is kept over a predetermined time, and the SOCv calculation accuracy is not possible to be secured is kept), the request flag is set as follows. In other words, when the charging/discharging pattern is largely deviated to the charging, the request flag is set to "1". When the charging/discharging pattern is largely deviated to the discharging, the request flag is set to "2". When the adjustment of the charging/discharging is ended, and the adjustment is not necessary any more, the request flag is set to "0".

Figure 21:
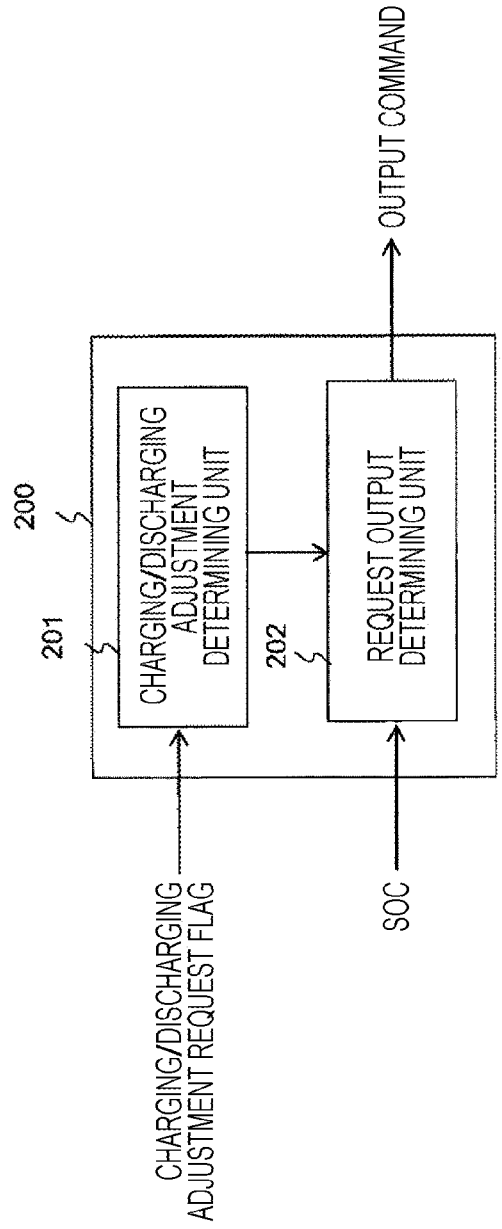
FIG. 21 is a block diagram illustrating a vehicle control unit in the third embodiment.

FIG. 21 is a diagram illustrating the vehicle control unit 200 in the third embodiment. The vehicle control unit 200 includes a charging/discharging adjustment determining unit 201 and a request output determining unit 202. The charging/discharging adjustment determining unit 201 determines whether the adjustment of the charging/discharging is necessary on the basis of the charging/discharging adjustment request flag. The request output determining unit 202 determines a request output (drive force) command to the inverter 400 and the motor 410 on the basis of the output from the charging/discharging adjustment determining unit 201, and the state detection result such as the SOC and the power which can be input/output. The output from the request output determining unit 202 is transmitted to the motor/inverter control unit 420.

In a case where the charging/discharging adjustment request flag (the output from the battery pack control unit 150) is "1", the deviation to the charging is large. Therefore, the charging/discharging adjustment determining unit 201 transmits a request for adjusting the output distribution to the motor 410 to be increased compared to the engine toward the request output determining unit 202. On the other hand, in a case where the charging/discharging adjustment request flag is "2", the deviation to the discharging is large. Therefore, a request for adjusting the output distribution to the motor 410 to be decreased is transmitted to the request output determining unit 202.

Further, while the details are not illustrated, the distribution of a braking force between a regenerative brake and a hydraulic brake may be controlled such that the charging frequency of the battery system 100 is increased by increasing a ratio of a distribution of the braking force of the regenerative brake so as to release the deviation to the discharging.

The request output determining unit 202 receives the SOC calculated by the SOC correction unit 151-5 of the battery system 100 and a request for the output distribution from the charging/discharging adjustment determining unit 201, determines an output (drive force) command to the motor 410, and transmits the output command to the motor/inverter control unit 420. The motor/inverter control unit 420 controls the inverter 400 and the motor 410 on the basis of the received output (drive force) command.

An application and an operational effect of the third embodiment will be described with reference to FIGS. 22 and 23. Further, it is assumed that the scheme described in the second embodiment is applied to the process of the battery state calculation unit 151 in this embodiment. In other words, a value obtained by correcting the SOCi using the difference between the SOCv and the SOCi is set to the SOC.

Figure 22:
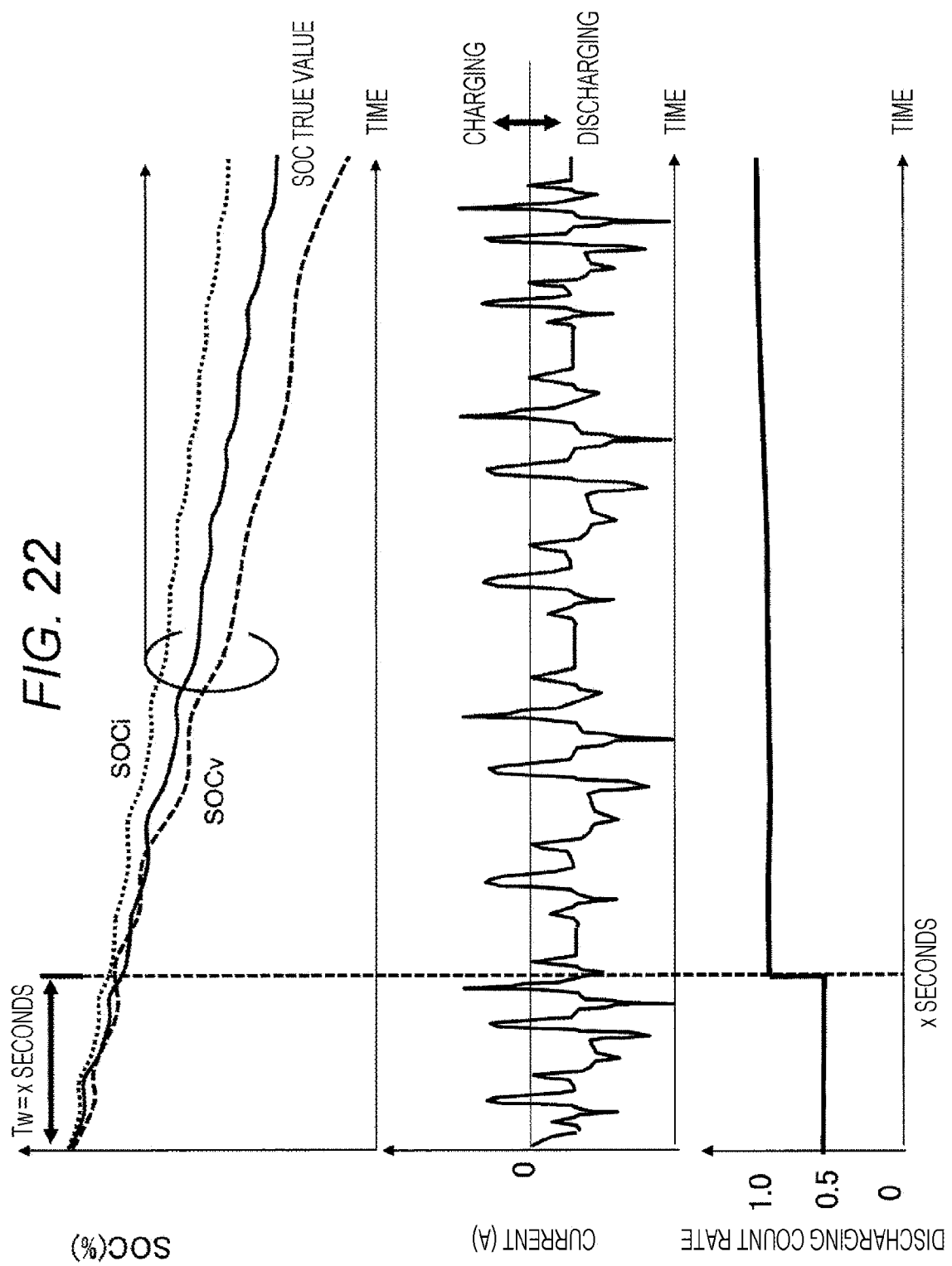
FIG. 22 is a diagram illustrating a relation between the discharging count rate with respect to the current waveform in an EV driving mode and a result of calculating the current-based SOC and the voltage-based SOC.

FIG. 22 illustrates the SOC calculation result in a case where the control according to the third embodiment is not applied. The current waveforms illustrated in FIG. 22 show a pattern of overdischarging in the EV driving mode in the PHEV (the discharging is primary), in which the state that the discharging count rate is near "1.0" is kept. As described in the first and second embodiments, it is difficult to calculate the polarized component under such a situation, and thus it is not possible to secure the SOC calculation accuracy. Therefore, the SOCi is employed. However, in a case where the SOC is calculated on the base of the SOCi, the error caused by the integrated current error according to the integration of the current is increased.

Figure 23:
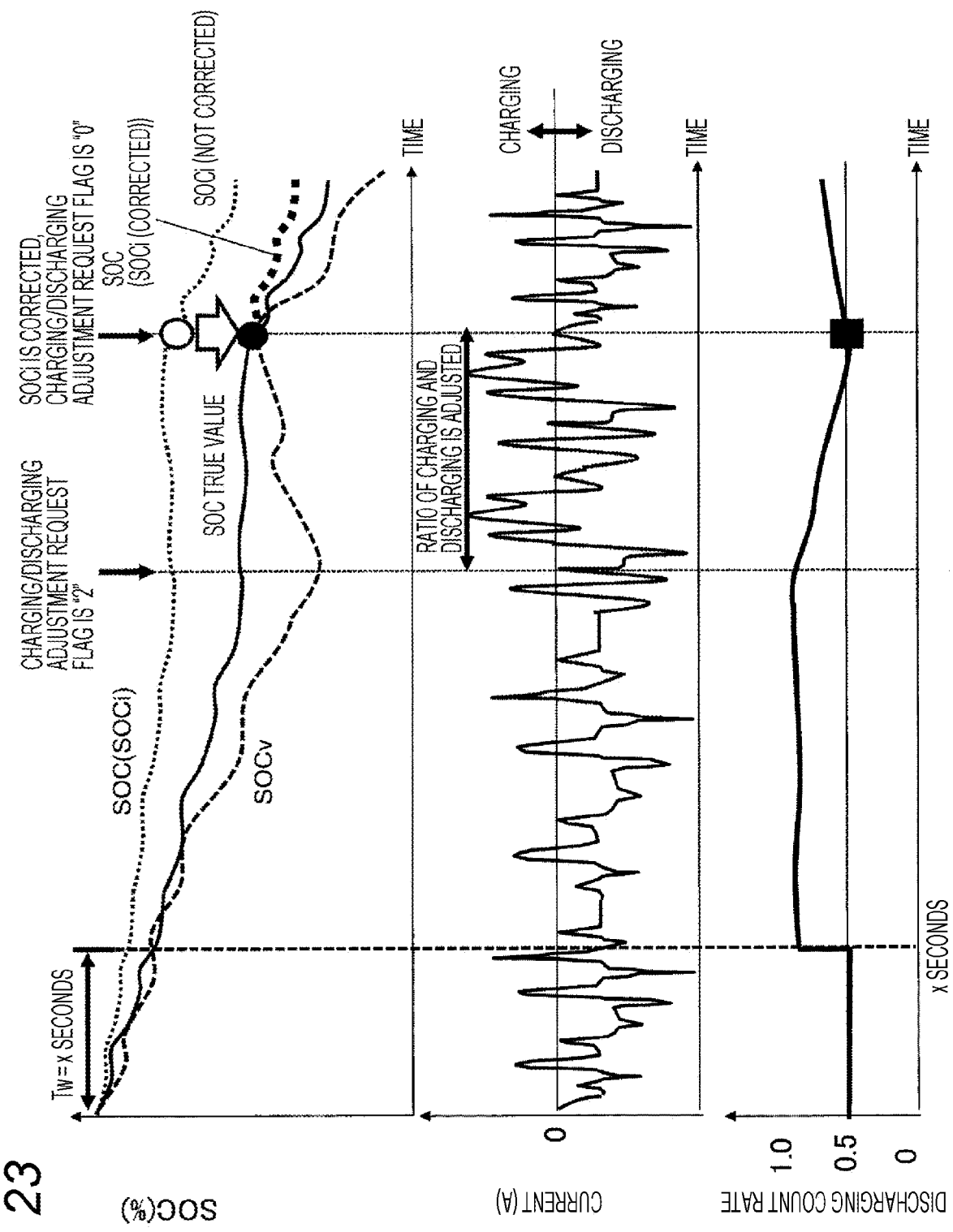
FIG. 23 is a diagram for describing an effect of the third embodiment.

FIG. 23 illustrates an SOC calculation result in a case where the control according to the third embodiment is applied. Since the charging/discharging proceeds in a state of overdischarging similarly to FIG. 22 after the charging/discharging starts, the discharging count rate becomes a value larger than "0.5". Therefore, the SOCi is employed as the SOC calculation value. When it is detected that the discharging count rate becomes a high value continuously during a predetermined period, the charging/discharging adjustment request flag is set to "2". In a case where the charging/discharging adjustment request flag is "2", it is determined that the charging/discharging is largely deviated to the discharging. The charging/discharging is controlled to increase the charging frequency. As a result, the discharging count rate is gradually decreased, the charging frequency and the discharging frequency become substantially equal (that is, near 0.5 where the SOCv calculation accuracy can be secured), and the SOCi is corrected using the difference between the SOCv and the SOCi. When the SOCi is corrected, the charging/discharging adjustment request flag is set to "0", and the control returns to a normal EV driving mode. Since the error accumulated until the SOCi is corrected is reset by the correction, it is possible to suppress the SOCi error from being increased.

According to the battery control device of the third embodiment, the following operational effect can be achieved.

The battery control device 190 of the third embodiment includes the charging/discharging request command determining unit 153 which transmits a command of requesting the adjustment of the charging/discharging to the vehicle control unit 200 or the motor/inverter control unit 420 in a case where it is determined that the battery is used while being deviated to the charging or the discharging on the basis of the load feature amount. In a case where the charging/discharging request command determining unit 153 determines that the battery is used while being deviated to the charging or the discharging, the motor/inverter control unit 420 controls the operations of the inverter and the motor such that the charging and discharging frequencies become equal.

According to the third embodiment, in a case where it is detected that the charging frequency or the discharging frequency is high on the basis of the load feature amount (herein, an index such as the discharging count rate), the inverter 400 and the motor 410 are controlled to adjust the charging/discharging of the battery such that the charging frequency or the discharging frequency becomes equal. As a result, it is possible to correct the SOCi which is concerned about the influence of the accumulated error, so that the SOC can be estimated with a high accuracy. Accordingly, it is possible to secure the reliability of the electric motor vehicle system 800 and to use the battery with efficiency.

Further, the third embodiment has been described about the SOC calculation method in the battery state calculation unit 151 with reference to the content of the second embodiment. However, the SOC calculation method described in the first embodiment may be applied. In addition, the discharging count rate has been exemplified as the load feature amount, but the invention is not limited thereto. An average value of the current may be used. For example, when the average current value approaches zero, it is considered that the SOCv calculation is preferable. Therefore, it is possible to calculate the SOC with a high accuracy on the basis of the index as described above.

In addition, the third embodiment has been exemplified about a case where the ratio of the charging and the discharging is adjusted by adjusting the output distribution with respect to the engine when the charging/discharging adjustment request flag is "1" or "2", but the control of the charging/discharging frequency using the inverter and the motor is not limited thereto.

Fourth Embodiment

A fourth embodiment will be described on the basis of FIGS. 24 to 26. Further, an exemplary configuration of the electric motor vehicle system 800 of the plug-in hybrid electric vehicle in this embodiment is similar to that of the first embodiment illustrated in FIG. 1, and the description will be given focusing on a difference from the third embodiment.

In the third embodiment, the motor and the inverter are controlled as the following first to fourth steps to switch the charging/discharging frequency.

In the first step, the load feature amount (for example, the discharging count rate) is calculated from the charging/discharging pattern.

In the second step, in a case where the load feature amount is a predetermined value (for example, the discharging count rate is 0.5), it is determined that the SOCv calculation accuracy is preferable.

In the third step, it is determined whether it is a situation where the SOCi is kept on employing.

In the fourth step, in a case where it is determined that it is a situation where the SOCi is kept on employing, the charging/discharging is controlled such that the discharging count rate becomes 0.5. For example, the SOC calculation accuracy is secured by adjusting the output distribution with respect to the engine.

An exemplary configuration of the battery pack control unit 150 in the fourth embodiment has the same configuration as that illustrated in FIG. 20. The SOC calculation process of the battery state calculation unit 151 of the battery pack control unit 150 will be described by taking an exemplary method in which the SOCi and the SOCv described in the second embodiment are compared to be corrected.

Figure 24:
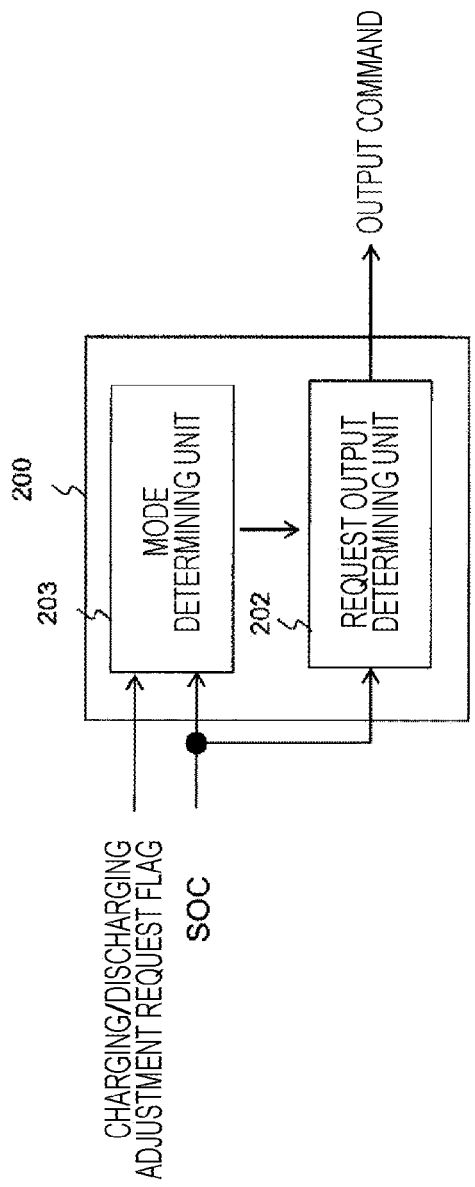
FIG. 24 is a block diagram illustrating the vehicle control unit in a fourth embodiment.

FIG. 24 illustrates an example of the vehicle control unit 200 in the fourth embodiment.

The vehicle control unit 200 includes a mode determination unit 203 and the request output determining unit 202. The mode determination unit 203 determines a driving mode of the electric motor vehicle on the basis of the charging/discharging adjustment request flag and the SOC. The request output determining unit 202 outputs an output (drive force) command of the motor 410 on the basis of the output of the mode determination unit 203 and the SOC. The output of the request output determining unit 202 is transmitted to the motor/inverter control unit 420.

The mode determination unit 203 outputs a switching request from an EV mode to an HEV mode when the charging/discharging adjustment request flag becomes "1" or "2" and the SOC is decreased, and outputs the request to the request output determining unit 202. As described above, this embodiment is different from the third embodiment in that the charging/discharging pattern is adjusted by switching a driving mode of the vehicle.

The request output determining unit 202 receives the SOC of the battery system 100 and a mode switching request from the mode determination unit 203. The request output determining unit 202 determines an output (drive force) command to the motor 410, and transmits the output command to the motor/inverter control unit 420. The motor/inverter control unit 420 controls the inverter 400 and the motor 410 on the basis of the received output (drive force) command.

An application and an operational effect of the fourth embodiment will be described with reference to FIGS. 25 and 26.

Figure 25:
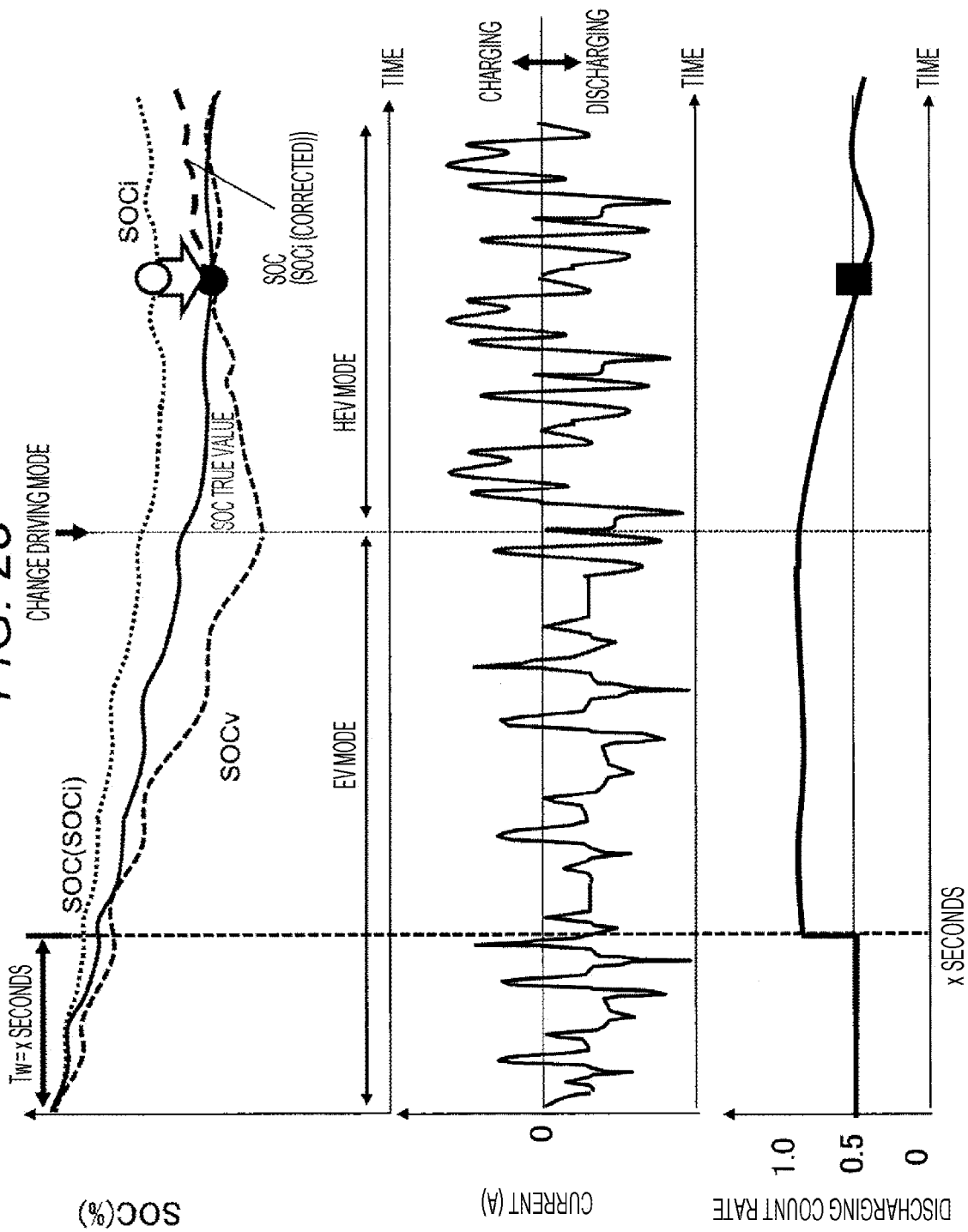
FIG. 25 is a diagram for describing an effect of the fourth embodiment (Part 1).

FIG. 25 illustrates an exemplary SOC calculation result in a case where the fourth embodiment is applied to the PHEV having the EV mode and the HEV mode.

When the charging/discharging proceeds in a state of overdischarging similarly to FIG. 22 after the charging/discharging starts, the discharging count rate becomes a value larger than "0.5". Therefore, the SOCi is employed as the SOC calculation value. When it is detected that the discharging count rate becomes a high value continuously during a predetermined period, the charging/discharging adjustment request flag is set to "2", and the drive mode transitions to the HEV mode. When the mode transitions to the HEV mode, the ratio of the charging and the discharging is substantially equal, so that the correction is enabled on the basis of the SOCv. After the correction based on the SOCv, the charging/discharging adjustment request flag is set to "0". At this time, an accumulated error of SOCi is reset.

The electric motor vehicle system 800 of the fourth embodiment described above includes the charging/discharging request command determining unit 153 which detects whether the battery is deviated to the charging or the discharging, and the mode determination unit 203 which selects as a driving mode of the electric motor vehicle from any one of a first driving mode (for example, the EV mode) in which any frequency of the charging and the discharging of the battery is high and a second driving mode (for example, the HEV mode) in which the frequencies of the charging and the discharging of the battery are the same degree. The mode determination unit 203 changes the driving mode of the electric motor vehicle from the first driving mode to the second driving mode when a first condition where the first driving mode is selected and a second condition in a case where the charging/discharging request command determining unit 153 determines that the charging/discharging current of the battery is deviated to the charging or the discharging are satisfied.

More specifically, the electric motor vehicle system 800 of the PHEV of the fourth embodiment has the following operational effect.

The driving mode is switched to the HEV mode when it is determined that the vehicle is running in the EV mode (discharging is primary) for a long time. In the HEV mode, the frequencies of the charging and the discharging become almost the same degree, and the SOCv calculation accuracy can be secured. In the fourth embodiment, the charging/discharging is controlled by switching the driving mode, and thus the SOC calculation accuracy is secured.

For example, the SOCv is calculated by Expressions (1A) to (1C) indicating the first charging state amount to manage the battery. A driving mode switching control is performed to take a balance in the charging/discharging current in the electric motor vehicle system which uses the battery control device. As a result, the SOC calculation accuracy can be secured by applying a method of performing three SOC calculations such as the SOCv calculation in the first embodiment, the SOCi calculation, and the combination calculation of the SOCv and the SOCi, and a method of calculation by correcting the SOCi using the difference between the SOCv and the SOCi in the second embodiment, and thus the battery can be efficiently used. As a result, it is possible to improve a reliability of the electric motor vehicle system.

Similarly to the first embodiment, the charging/discharging request command determining unit 153 can determine a deviation of the charging/discharging on the basis of the ratio of the number of times of charging and the number of times of discharging of the battery or by performing a moving average process on the current of the battery, which are calculated by the load feature amount calculation unit 152.

FIG. 25 illustrates an example in which the vehicle keeps on running in the HEV mode without returning to the EV mode, but the mode may return to the EV mode again.

With the control of the fourth embodiment, the error accumulated until the SOCi is corrected is reset, so that it is possible to suppress the SOCi error from being increased.

According to the fourth embodiment, the driving mode of the electric motor vehicle is determined on the basis of the load feature amount (herein, an index such as the discharging count rate), and the charging/discharging is controlled such that the SOCv calculation accuracy is secured. As a result, it is possible to correct the SOCi which is concerned about the influence of the accumulated error, so that the SOC can be estimated with a high accuracy. Accordingly, it is possible to secure the reliability of the electric motor vehicle system 800 and to use the battery with efficiency.

Further, the driving mode in this embodiment is not limited to the EV mode and the HEV mode. This embodiment can also be applied to an REEV mode (a mode of charging the battery by generating power using the engine) in an electric vehicle (range extender EV (REEV)) equipped with the power generating engine.

Figure 26:
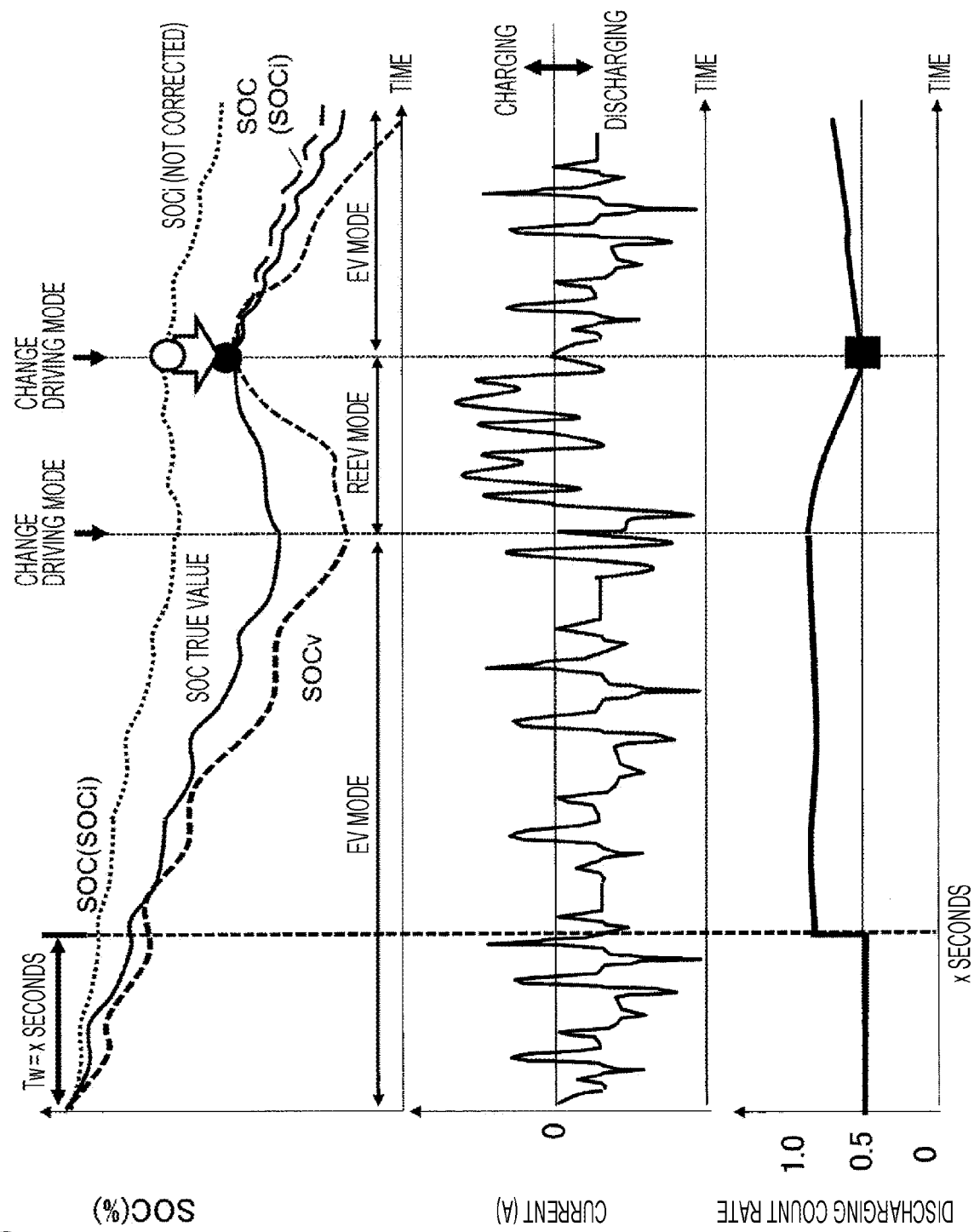
FIG. 26 is a diagram for describing an effect of the fourth embodiment (Part 2).

FIG. 26 illustrates an exemplary SOC calculation result in a case where the fourth embodiment is applied to the REEV.

Since the charging/discharging proceeds in a state of overdischarging similarly to FIG. 25 after the charging/discharging starts, the discharging count rate becomes a value larger than "0.5". When it is detected that the discharging count rate larger than 0.5 becomes a large value continuously during a predetermined period, the charging/discharging adjustment request flag is set to "2". When the flag is set to "2", the drive mode transitions to the REEV mode where the power generating engine is driven. When the drive mode transitions to the REEV mode, the ratio of the charging and the discharging becomes almost equal or the frequency of the charging becomes high. Therefore, the discharging count rate approaches "0.5", and the correction can be made on the basis of the SOCv. After the correction based on the SOCv, the charging/discharging adjustment request flag is set to "0".

FIG. 26 illustrates an example in which the drive mode returns to the EV mode after correcting the SOCi.

With the control of the fourth embodiment, the error accumulated until the SOCi is corrected is reset, so that it is possible to suppress the SOCi error from being increased.

In addition, an exemplary configuration of the battery pack control unit 150 in this embodiment may be equal to any one of those of FIGS. 3 and 20.

In the above embodiment, the description has been given about an example of the plug-in hybrid electric vehicle (PHEV), but the invention is not limited thereto. The invention may also be applied to a battery control device for a car such as a hybrid electric vehicle (HEV), an electric vehicle (EV), and an industrial vehicle such as a hybrid railway vehicle and an electric motor vehicle system.

In the above embodiment, the cell 111 is described as a lithium ion battery, but the invention is not limited thereto. For example, the invention may also be applied to a nickel-hydrogen battery and a lead batter.

The invention is not limited to the content mentioned above. Other aspects which may be considered as falling within technical ideas of the invention are included in the scope of the invention.

REFERENCE SIGNS LIST 100 battery system
110 battery pack
111 cell
112 cell group
120 cell management unit
121 cell control unit (monitor four cells 111)
122 voltage detection circuit
123 control circuit
124 signal input/output circuit
125 temperature detection unit
130 current detection unit
140 voltage detection unit
150 battery pack control unit
151 battery state calculation unit
152 load feature amount calculation unit
160 signal communication unit
170 insulation element
180 storage unit
190 battery control device
200 vehicle control unit
201 charging/discharging adjustment determining unit
202 request output determining unit
203 mode determination unit
300, 310, 320, 330 relay
400 inverter
410 motor 420 motor/inverter control unit
500 charger
800 electric motor vehicle system

The invention claimed is:

1. A battery control device for an electric motor vehicle, comprising:
 a current detection unit configured to measure a current flow to a battery and to provide current value measurements over a period of time on the basis of the measured current flow;
 a battery pack control unit that receives at least the current value measurements from the current detection unit, the battery pack control unit including:
  a load feature amount calculation unit that calculates a load feature amount indicating a charging and discharging pattern of the battery on the basis of the current value measurements;
  a first state of charge amount calculation unit that calculates a first state of charge amount of the battery on the basis of at least an integrated value of the current value measurements at a time of operation;
  a second state of charge amount calculation unit that calculates a second state of charge amount of the battery on the basis of at least the current value measurements at the time of operation; and
  a third state of charge amount calculation unit that calculates a third state of charge amount of the battery on the basis of the load feature amount, the first state of charge amount, and the second state of charge amount;
 wherein the load feature amount calculation unit calculates a weighting coefficient that is assigned to the first state of charge amount and the second state of charge amount of the battery on the basis of the calculated load feature amount;
 wherein the third state of charge amount calculation unit combines the first state of charge amount and the second state of charge amount using the weighting coefficient to calculate the third state of charge amount;
 wherein the load feature amount calculation unit calculates the charging and discharging pattern on the basis of a ratio of a number of times of charging and a number of times of discharging of the battery, and calculates the weighting coefficient on the basis of the charging and discharging pattern,
 wherein the battery pack control unit is configured to output information relating to the third state of charge amount of the battery to a vehicle control unit configured to command a charging and discharging adjustment of the battery on the basis of the third state of charge amount.

2. The battery control device according to claim 1,
 wherein the first state of charge amount of the battery is further calculated on the basis of a measured open circuit voltage and a full-charged capacity of the battery, and
 wherein the second state of charge amount of the battery is further calculated on the basis of an open circuit voltage that is estimated on the basis of an equivalent circuit model of the battery.

3. The battery control device according to claim 1,
 wherein the first state of charge amount of the battery is further calculated on the basis of an open circuit voltage measured at the time of operation when a charging and discharging current is smaller than a first predetermined value, and
 wherein the second state of charge amount of the battery is further calculated on the basis of an estimated open circuit voltage that is estimated on the basis of the current value measurements at the time of operation when the charging and discharging current is equal to or more than a second predetermined value.

4. The battery control device according to claim 1,
 wherein the third state of charge amount calculation unit calculates a correction amount on the basis of a difference between the first state of charge amount and the second state of charge amount, and calculates the third state of charge amount by correcting the second state of charge amount on the basis of the correction amount.

5. The battery control device according to claim 1, wherein the charging and discharging adjustment of the battery is calculated on the basis of the third state of charge amount, and wherein the vehicle control unit is configured to control at least one of an inverter connected to the battery and a charger connected to the battery on the basis of the third state of charge amount.

6. The battery control device according to claim 1, further comprising at least one cell control unit configured to monitor and control a state of at least one cell,
 wherein an input signal transmitted by the battery pack control unit is input into the at least one cell control unit, and an output signal transmitted by the at least one cell control unit is output to the battery pack control unit such that the battery pack control unit and the at least one cell control unit are connected in a loop.

7. The battery control device according to claim 1,
 wherein the battery control device further includes a voltage detection unit configured to measure a voltage of the battery and to provide a voltage value measurement on the basis of the measured voltage, and
 wherein the first state of charge amount of the battery is calculated on the basis of at least the voltage value measurement obtained by the voltage detection unit.

* * * * *